US005455579A

United States Patent [19]

Bennett et al.

[11] Patent Number: 5,455,579

[45] Date of Patent: * Oct. 3, 1995

[54] DIGITIZED STORED VOICE PAGING RECEIVER

[75] Inventors: Paul T. Bennett, Phoenix, Ariz.; David F. Willard, Plantation, Fla.; Omid Tahernia, Coconut Creek, Fla.; James C. Page, Lake Worth, Fla.; Allan I. Spiro, Boynton Beach, Fla.; Frank E. Lambrecht, Miramar, Fla.

[73] Assignee: Motorola, Inc., Schaumburg, Ill.

[ * ] Notice: The portion of the term of this patent subsequent to Oct. 23, 2007 has been disclaimed.

[21] Appl. No.: 564,010

[22] Filed: Aug. 7, 1990

Related U.S. Application Data

[63] Continuation of Ser. No. 323,056, Mar. 14, 1989, Pat. No. 4,965,569, which is a continuation of Ser. No. 68,682, Jun. 30, 1987, abandoned.

[51] Int. Cl.$^6$ .......... H03M 1/00

[52] U.S. Cl. .......... 341/110

[58] Field of Search .......... 341/110, 112, 341/122, 144, 155, 157, 200; 381/31; 358/138; 455/38, 49, 53, 54, 68, 70; 307/353

[56] References Cited

U.S. PATENT DOCUMENTS

| | | |
|---|---|---|
| 4,412,217 | 10/1983 | Willard et al. . |
| 4,468,813 | 8/1984 | Burke et al. . |
| 4,477,807 | 10/1984 | Nakajima et al. . |
| 4,479,124 | 10/1984 | Rodriguez et al. . |
| 4,492,742 | 1/1985 | Raizen et al. . |
| 4,495,647 | 1/1985 | Burke et al. . |
| 4,677,657 | 6/1987 | Nagata et al. . |
| 4,701,943 | 10/1987 | Davis et al. . |
| 4,713,661 | 12/1987 | Boone et al. . |
| 4,839,923 | 6/1989 | Kotzin . |

FOREIGN PATENT DOCUMENTS

| | | |
|---|---|---|
| 8704309 | 7/1987 | WIPO . |

*Primary Examiner*—Brian K. Young
*Attorney, Agent, or Firm*—Philip P. Macnak; John H. Moore

[57] ABSTRACT

A paging receiver device and method are disclosed in which analog information transmitted from an external source such as a paging transmitter are received and decoded. The analog information includes at least one voice message. The voice message is recovered, digitized, and stored in one of a plurality of message slots in a memory of the paging receiver. In response to a paging user's request, the digitized stored message is recalled from memory, reconverted from digital information to analog information, and used to produce audible voice information being a replica of the original analog voice message.

16 Claims, 13 Drawing Sheets

10
INPUT MODULE
42
MODE
60
SILENT
PTL
RESET
PLAY
ON/OFF
58
56
54
BATTERY
16
18
SWITCH INTERFACE
B+
55
MEMORY MEANS
50
MICROCOMPUTER
READ ONLY MEMORY
30
MICRO-PROCESSOR
28
26
DECODER
14
CODE MEMORY
PAGER I.D.
FUNCTION SELECT
22
SUPPORT MODULE
40
TRANSDUCER INTERFACE
36
35
34
33
32
M
L
L
62
46
48
38
CODEC
21
23
44
12
ANTENNA
24
RECEIVING MEANS
VOLTAGE CONVERSION MEANS
20
B+

DIGITIZED STORED VOICE PAGING RECEIVER

This is a continuation of application Ser. No. 07/323,056, filed Mar. 14, 1989, now U.S. Pat. No. 4,965,569 which is a file wrapper continuation of application Ser. No. 07/068, 682, filed Jun. 30, 1987, now abandoned.

BACKGROUND OF THE INVENTION

1. Field of the Invention

This invention relates to paging receivers, and more particularly, to a paging receiver for receiving information including analog voice messages, digitizing the analog voice messages and storing the voice messages in a memory for playback.

2. Background of the Invention

Communications systems in general and paging systems in particular using transmitted call signals have attained widespread use for calling selected receivers to transmit information from a base station transmitter to the receivers. Modern paging systems and paging receivers in particular have achieved multifunction capabilities through the use of microcomputers which allow the paging receiver to respond to information having various combinations of tone, tone and voice, or data messages. This information is transmitted using any number of paging coding schemes and message formats.

In the operation of such paging receivers, important factors involved in their successful operation is the portability of the receiver, the limited energy available for the receiver, the limited availability of the radio spectrum, the fast response time required in today's active Society, and the number of paging receivers included in the paging system. In such paging receivers, in order that the drain on the battery may be minimized, the paging receiver is systematically turned off and turned on to maximize the length of time energy is available from the battery (battery saving). The limited energy in which the paging receiver must operate constrains the type of electronic circuitry available for a paging receiver.

A typical voice type paging system uses analog voice channels for the transmission and reception of voice messages. While certain types of paging systems use binary signalling formats, transmission in an analog form remains the most common technique for voice signals. Prior art paging receivers that receive analog representation of voice signals are limited in several features that would be highly desirable. These include the ability to store a voice message in a reasonable size memory for recall at a later time and use of digital modulation techniques to store and reconstruct voice messages in the paging receiver. Digital processing of voice messages is, in general, qualitatively superior to analog processing. This is a result of the fact that once the voice message is in a digitally-represented form, it is not subject to the type of signal degradation that occurs in analog processing. Thus, it is beneficial to represent the voice message in digital form rather than as a voltage subject to the type of distortion inherent in analog processing techniques.

Another problem with prior art analog voice paging receivers is the ability to store a plurality of voice messages and selectively recall a voice message. Prior art analog voice paging receivers have typically stored the voice information on conventional analog magnetic tapes (e.g. U.S. Pat. No. 4,356,519). While such voice type paging receivers are available, they are typically commercially inoperative. Some of the reasons are the cost of the electronic components, the low battery life from the high drain of current required by the tape mechanism, and the difficulty in operating in a battery saving environment. Additionally, if a sequence of messages is stored on the tape, the recall of a single message is hampered by the inability of the analog magnetic tape to randomly select a single message.

SUMMARY OF THE INVENTION

It is therefore an object of the present invention to overcome the problems of the prior art analog voice paging receivers by providing a digitized stored voice paging receiver.

It is another object of the present invention to provide a paging receiver capable of receiving, digitizing and storing a plurality of voice messages for later recall.

It is another object of the present invention to provide a digitized stored voice paging receiver that permits the user to selectively play back a digitized voice message out of a plurality of stored voice messages.

These as well as other objects and advantageous features of the present invention will be apparent and in part pointed out here after.

In general, a communication receiver, such as a paging receiver for receiving analog information having at least one voice message, includes a receiving means, a decoding means, a memory means, and a conversion means. The receiving and decoding means receives information signals, including at least one voice message and control signals, decodes the information signals for selectively enabling a receiver correlating to the received control information, and decodes the information to recover the voice message. The conversion means converts the analog voice information to digital information, the digital information being representative of a replica of the analog voice message. The digital information is then stored in a memory of the selected receiver. In response to user generated inputs, the paging receiver selects a digitized voice message stored in the memory of the receiver, reconverts the digitized voice to an analog signal, and produces audible voice information from the analog signal representative of the original analog voice message.

In particular, the paging receiver includes a plurality of control switches. A first control switch initiates the playback of a previously stored voice message. A second control switch extinguishes the presentation of the analog voice message to the paging user. Finally, a third control switch selects a particular operating mode for the paging receiver.

CROSS-REFERENCE TO RELATED PATENT APPLICATIONS

The present patent application is one of a group of copending patent applications which concern the same overall paging receiver configuration but which individually claim different inventive concepts embodied in such overall paging receiver configuration. These related patent applications were filed on the same date, namely, Jun. 30, 1987, are specifically incorporated by reference herein, and are more particularly described as follows:

1) Application Ser. No. 07/068,073 entitled "Digitized Stored Voice Paging Receiver Having a Single Input User Control", the inventors being Fisch et al., having attorney's docket number CM00459J, assigned to the assignee of the present application; and 2) Application Ser. No. 07/068,683 entitled "Prioritization of Stored Messages in a Digital Voice Paging Receiver", the inventors being Fisch et al., having attorney's docket number CM00485J, assigned to the assignee of the present application.

BRIEF DESCRIPTION OF THE DRAWINGS

For the purpose of illustrating the invention, there is shown in the drawings an embodiment which is presently preferred, it being understood, however, that the invention is not limited to the precise arrangement and instrumentality shown.

TABLE OF CONTENTS

DETAILED DESCRIPTION OF THE PREFERRED EMBODIMENT

I. General Description
  A. Paging Receiver
  B. Operation
  C. Paging Scheme
II. Hardware Embodiment
III. Operation
  A. Record State
    1. Normal Mode
    2. Push to Listen (PTL) Mode
    3. Silent Mode
  B. Play State
  C. Reset State
IV Microprocessor Embodiment of the Present Invention
  A. Power On Routine
  B. Interrupt Routine
  C. Play A Routine
  D. Play B Routine
  E. Record Routine

DETAILED DESCRIPTION OF THE PREFERRED EMBODIMENT

I. General Description

A. Paging Receiver

In order to best illustrate the utility of the present invention, it is described in conjunction with a communication receiver, such as a paging receiver, capable of receiving, decoding, and storing transmitted analog or voice information. While the present invention is described hereinafter with particular reference to a paging receiver, it is to be understood at the outset of the description which follows it is contemplated that the apparatus and methods, in accordance with the present invention, may be used with numerous other communication receiving systems.

The paging receiver system described herein is associated with a paging system having a base station terminal, responds to coded data information from the base station terminal, and in turn, decodes, digitizes, stores, and provides analog or voice messages to a user during operation. With reference to the drawings in general, there is illustrated a paging receiver 10 and a method for receiving, decoding, digitizing, and storing voice messages transmitted from the base station terminal. The method in one form of the present invention includes a hardware controller for decoding, digitizing, storing and playing back messages. Another form of the invention includes a microcomputer embodiment of the hardware controller.

Figure 1:
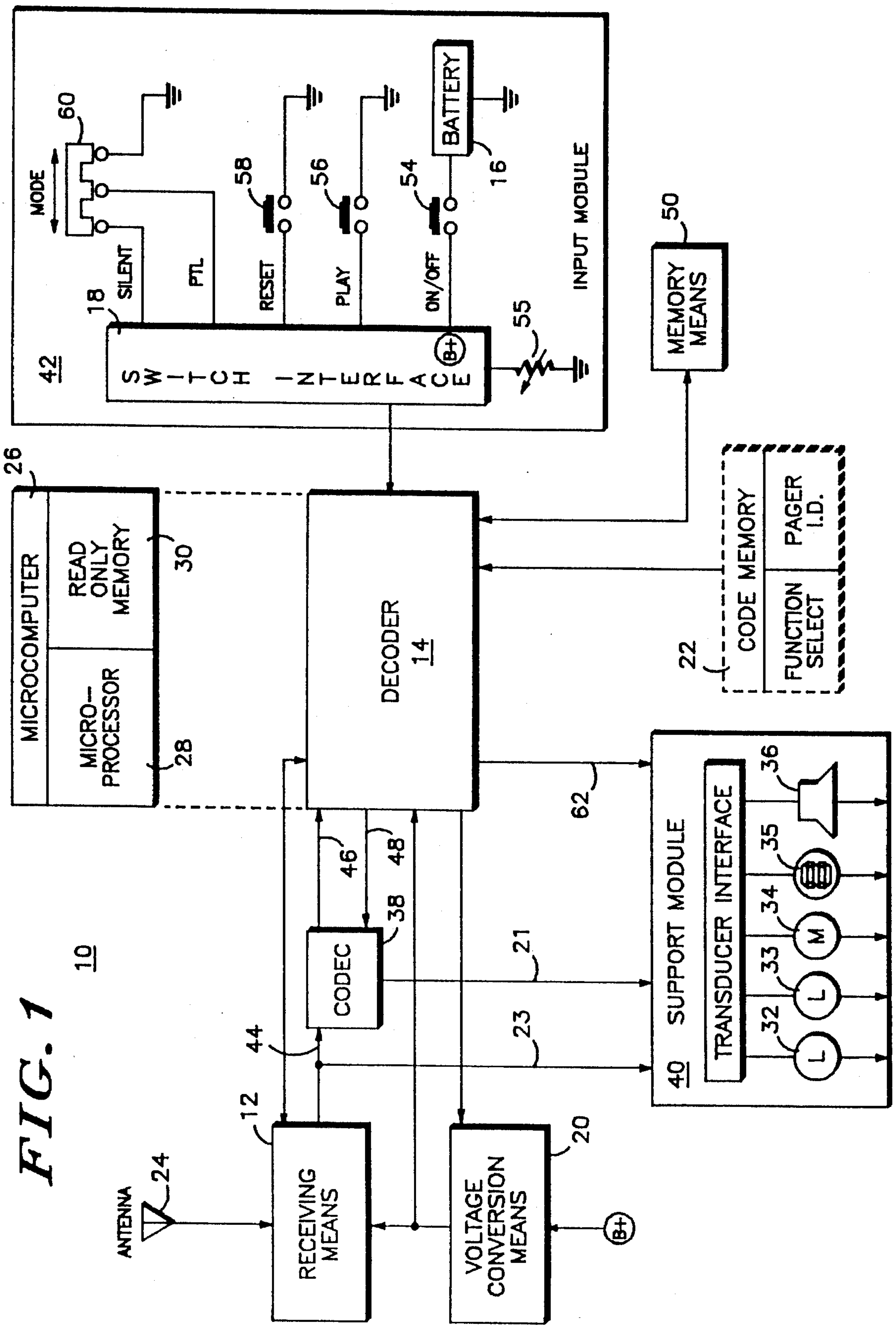
FIG. 1 is a schematic diagram of a digitized stored voice paging receiver embodying the present invention.

FIG. 1 shows a functional block diagram applicable to both a first and second embodiment of the present invention. The paging receiver 10 of the present invention includes a receiving means 12, a decoding means 14, a memory means 50, a support module 40, an input switch module 42, a voltage conversion means 20, and a converting means 38. An antenna 24 receives paging information including receiver control signals and analog information including speech signals representative of a voice message. The antenna 24 is coupled to receiving means 12 that is subject to the control of decoder 14. The decoder 14 not only controls receiving means 12, but may also operate receiving means 12 on an intermittent basis to extend the life of battery 16 through voltage conversion means 20. The receiving means 12 detects the presence of electromagnetic energy representing the paging information and applies the information to the converting means such as coder-decoder 38. The coder-decoder 38 converts the received analog signals, such as real time audio speech signals, to a stream of binary bits and reconverts stored binary bits to a replica of the original received analog signals, such as synthesized audio speech signals.

In the illustrated embodiment, the coder-decoder 38 (hereinafter referred to as CODEC) provides for the digital-to-analog and analog-to-digital conversion of speech signals. The CODEC 38, such as an adaptive delta modulator, can convert or encode an audio input signal to a digital data stream for storage and reconvert or decode a digital data stream to reconstruct an audio signal. In particular, the CODEC 38 monitors the real time audio signal on line 44 and compares it to a past value that it has reconstructed and generates a digital bit (sign) that indicates whether the reconstructed signal's voltage level is higher or lower than the present input value. The CODEC 38 then tries to adapt the reconstructed signal voltage to mirror the present value at the audio input by varying or modulating a current. The current charges or discharges a capacitor (not shown) which changes the reconstructed signal's voltage. The digital output on line 46 is the sign bit which indicates whether the reconstructed signal is behind the input or lower in voltage (logic "0") or ahead of the input or higher in voltage (logic "1"). The CODEC's digital output is stored in memory 50 and retrieved on line 48 to reconstruct a synthesized audio signal on line 21, thus closely replicating the real time audio signal in both amplitude and frequency. One example of such a coder-decoder is disclosed by N. S. Jayant in the publication "Adaptive Delta Modulation with a One-Bit Memory", Bell System Technical Journal, Vol. 49, No. 2, March 1970. The CODEC 38 is designed to operate at sampling rates (bit or clock rates) of 16 KHz, 25 KHz, and 33 KHz. The obvious implication of the three rates is that for slower clock rates, longer messages can be stored in a fixed amount of memory at the expense of a lower signal to noise (S/N) ratio. For example, at a 100 mV P—P 1 KHz signal at the input, the signal to noise degradation is 11 dB at 33 KHz, 14 dB at 25 KHz, and 23 dB at 16 KHz.

To conserve power, most of the CODEC 38 is turned off when there are no read/write operations to the memory. The output buffers and control logic are always on since it may be necessary to monitor the channel or provide a BEEP tone when there are no messages stored. Keeping the buffers and control logic on also eliminates the need for additional current source controls to handle the switching of an additional current source.

The receiving means 12 is further coupled by line 23 to a support module 40. Operating in response to decoder 14, the real time audio signal on line 23 is applied to support module 40 which supplies analog or digital signals to one of annunciation transducers 32–36. In particular, decoder 14 controls support module 40 to apply either the real time audio signal on line 23 or the synthesized audio signal on line 21 to speaker 36.

Decoder 14 is associated with memory means 50 which serves to include information for decoding the received information and for storing information received from CODEC 38. The CODEC 38 provides the analog-to-digital conversion of speech signals on line 46 which are stored in memory 50 as digital voice messages. A plurality of digital voice messages can be stored in memory 50 along with the status of each voice message. For example, a voice message may have either a read or unread status. The decoder 14 also functions to alert the paging user, store, recall, and playback voice messages.

The paging receiving of FIG. 1 has the capability of storing selective call voice messages for providing them to support module 40 according to the state of a plurality of inputs, such as the state of the control switches of input module 42. A switch interface 18 provides input capability for control switches 54–60. Illustratively, control switch 54 is an on/off switch for controlling power from battery 16. Control input 55 is a volume control for speaker 36. Control switch 56 is a play switch for playing back voice messages previously digitized and stored in memory 50. Control switch 58 is a reset switch to reset the paging receiver system and monitor the real time audio signal. Control switch 60 is a mode switch for operating the decoder in one of three modes. These modes are the silent, push to listen (PTL), and normal modes, the operation of which is explained in detail with reference to FIG. 4.

Considering FIG. 1 in somewhat further detail, the battery 16 is shown connected to decoder 14 through a switch interface 18. Battery 16 provides power to decoder 14 through a voltage conservation means 20, such as a DC to DC converter. Decoder 14 is additionally connected to a code memory 22 further including regions designated function select and pager ID. The enclosure of code memory 22 with a broken line indicates a possibility that such a device can be made removable and therefore separable from the rest of the system. Another output 62 of decoder 14 is coupled to support module 40 to provide the necessary controls for generating alerts on one of alert transducers 32–36. The alert transducers may take the form of an illumination means 32 and 33, such as an LED, a vibration motor 34, a visible display counter 35, and an audio speaker 36. Output 62 also controls whether real time audio signals on line 23 from receiving means 12 or synthesized audio signals on line 21 from CODEC 38 are applied to audio speaker 36.

A microcomputer 26 is shown interconnected with decoder 14 by a broken line. This interconnection indicates that hardware decoder may be functionally replaced entirely by a microcomputer 26. Microcomputer 26 is shown to be further comprised of a microprocessor 28 and a read only memory (ROM) 30. The ROM 30 includes the necessary instructions to operate microprocessor 28 to perform the functions as described in FIGS. 7–12B. Microcomputer 26 will have similar interconnections as does decoder 14. The replacement of decoder 14 by microcomputer 26 provides the exact same signal decoding functions and the resulting system function is indistinguishable to a paging user. Thus, the function of the two alternative embodiments are indistinguishable within a device.

B. Operation

The operation of the paging receiver shown in FIG. 1 is such that the receiving means 12 is capable of receiving messages in any of several message formats through an antenna 24. The decoder 14 responds to the receive signals to analyze the data and select one of several decoding schemes for appropriately decoding the incoming information received by receiving means 12. As with all paging devices, the resulting decoded signal is tested for comparison with a designated pager address contained in code memory 22. On detecting correspondence between the received and decoded signal and the address in code memory 22, the decoder instructs the CODEC 38 to digitize the real time analog signal and provide the digitized signal to the decoder 14 for storage in one of a plurality of message locations or slots in memory 50. An alert output signal is produced by the decoder 14 to generate an alert indicating to the pager user that a message has been received and stored. In particular, the alert output signal from the decoder 14 is supplied to support module 40 to produce a signal on one of a plurality of transducers 32–36 indicative of the receipt of the message. Specifically, upon the receipt of a message, an unread message indicator 32 is activated and an unread message counter 35 and message counter are incremented. Additionally, if all message slots are full, a memory full indicator 33 is activated.

Because of the requirements for high speed, real time signal processing and the requirement of preserving extended useful life of the battery contained in paging device, voltage conservation means 20 functions in cooperation with decoder 14 to conserve battery 16. It may also be appreciated that the decoder 14 may be designated to operate in only one of a plurality of possible decoding schemes. This selective function may be supplied by the code memory 22 or may be factory preset independently of the code memory 22. It may also be appreciated that code memory 22 may contain several addresses, each one corresponding to the appropriately selected decoding scheme which is determined by the decoder 14 in response to signals received by receiver 12.

In addition, code memory 22 includes a function select region which is used to select various features of the pager device. It is advantageous to build in the circuitry for all functions and then provide information in code memory 22 which identifies the address of the pager and designates various combinations of the possible function annunciation features of the system.

The replacement of a hardware decoder by microcomputer 26 including microprocessor 28 and the software included within the read only memory 30 region provides the same diagram with block 14 removed and replaced in its entirety by block 26. The difference is in the internal functions of the microcomputer in that instead of the hardware decoder responding to the receiver 12, the microcomputer 26 uses microprocessor 28 as a software decoder for processing the received signals in real time according to the same predetermined routine as the hardware decoder. After the paging receiver is selectively identified, microprocessor 28 accesses the read only memory 30 for determining the correct instructions contained in that memory for processing the received signals, storing the signals, and replaying the signals. For a better understanding of the processing, storing and replaying of the received signals, attention is directed to FIGS. 8 through 12B for a detailed description of the operation of the paging receiver.

Continuing with reference to FIG. 1, the voltage conservation means 20 interacts with the microprocessor 28 and ROM 30 to conserve the battery for the system. When the microprocessor 28 detects the reception of a signal corresponding to a pager identification contained in the code memory, microcomputer 28 connects with support module 40 to produce a signal on one of the plurality of transducers 32–36 to produce a signal so that the pager user is made aware that a message has been received and stored. For either the hardware decoder or microcomputer, the form of the alert signal pattern provided to the pager user by either the decoder or microprocessor is indistinguishable.

To briefly summarize, in either the hardware or software embodiment, real time analog information received from a base station by receiving means 12 is applied to CODEC 38 and support module 40. Operating under control of decoder 14, CODEC 38 converts the analog information to digital information which is stored in memory 50. Depending upon the configuration of mode switch 60, the real time audio information is presented to the user via speaker 36, an unread message indicator 32 is illuminated, and unread message counter 35 and message counter are incremented. Upon activating the play switch, a digitized voice message is selected from memory 50 and applied to CODEC 38. The CODEC 38 reconverts the digital information to analog information and supplies the analog information to support module 40. The support module applies the analog signal to the speaker to produce a synthesized voice message being a replica of the original analog voice information.

C. Paging Scheme

While it is clear that many types and formats of signal coding may be utilized for the present invention, the preferred embodiment uses a digital signal system designated as the Golay Sequential Code. The Golay Sequential Code (GSC) is a selective call paging protocol based largely on the current Golay binary paging format. A full description of the Golay code may be found in a paper entitled "Selective Signalling for Portable Applications" by Leonard E. Nelson, 28 IEEE Vehicular Technology Conference, Denver, Colo., Mar. 22–24, 1978. The Golay Sequential Code is an NRZ binary signalling format that has been greatly modified from the earlier format to accommodate intermixed tone only, tone and data, as well as tone and voice paging.

The GSC is an asynchronous paging format which allows pages to be transmitted individually or in batches. Maximum message throughput for tone only and tone and data pages is achieved in the batch transmission mode, while the individual call mode is useful in tone and voice paging.

Figure 2:
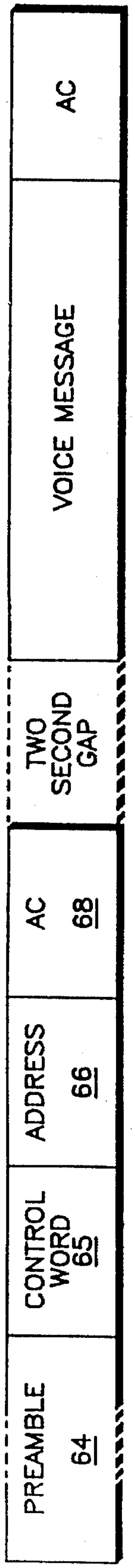
FIG. 2 illustrates a typical paging scheme useful in explaining the operation of the paging receiver.

FIG. 2 shows for the preferred embodiment of the present invention the timing diagram for the normal message signalling routine for a normal voice page format. The single call address format consists of a preamble 64, a control word 65, an address code 66, and for voice paging, an activation code (AC) 67. The preamble serves to divide pagers within the system into groups for improved battery life, as well as to uniquely identify GSC transmissions from other coding schemes to facilitate channel sharing without sacrificing battery life or false call integrity. The control word 65 delimits the end of the preamble and supplies timing information for the batch mode decoding. The address uniquely identifies each pager and the AC is used to control the pager audio circuits in voice paging. The batch mode of operation allows a string of addresses to be transmitted following the control word.

While this is normal for the operation of pagers generally, the address is followed by an activation code and upon the reception and detection of the activation code, the individually addressed pager, depending upon its mode, commences a two-second alert mode to warn the pager user of the presence of a subsequent voice message. At the conclusion of the variable length voice message, the inclusion of a deactivation control word which, for the preferred embodiment, is the second detected occurrence of the activation control word and results in muting the audio channel.

In addition to enabling pagers to operate in a battery saver mode, the polarity of the preamble identifies the transmission mode single call or batch. For instance, when the preamble words are transmitted with one predetermined bit polarity, the single call mode is identified. If the preamble bits are inverted, the batch mode is indicated.

The control word activation code and address code all use a two-word format consisting of 28 bits of comma followed by two (23,12) code words. The comma is a one comma bit reversal pattern transmitted at 600 bps. The two Golay code words (word 1 and word 2) are separated by a half bit space. The polarity of the half bit space shall be opposite the first bit of the second words and the starting comma bit must be the same polarity as the first bit of the first word. The control word and activation code are determined for the preferred system. Word 2 of the control word and activation code are the inverses of the fixed word.

The address format is identical to the control word and activation code formats regarding the number of bits, the rules for comma and the half bit space. The address word 2 may be chosen from any word of the (23,12) code except for all zeros and all ones combinations. Thus, there are 4094 potential second words made up of 12 information bits and 11 parity bits. The first words are chosen from a 100 word subset of the Golay code. To generate the binary bit patterns for the (23,12) Golay code, the decimal representation of the code word is converted into binary. This binary representation is rewritten least significant bit to the left.

The GSC format allows data pages to be intermixed with tone only or tone and voice pages. A data page consists of pager address followed by one or more data blocks. The data block is identical in length to an address block and may be freely substituted for addresses in the batch operating mode. The single call mode can also be used by following the pager address with the data message. Data information is transmitted at 600 bps to minimize the cross falsing probability between the addresses and data. For a more detailed description and implement of the Golay Sequential Code for tone, tone and voice, and data pages, reference is made to U.S. Pat. No. 4,427,980 assigned to the present assignee of the present invention, the disclosure of which is hereby incorporated by reference.

II. Hardware Embodiment

Figure 3:
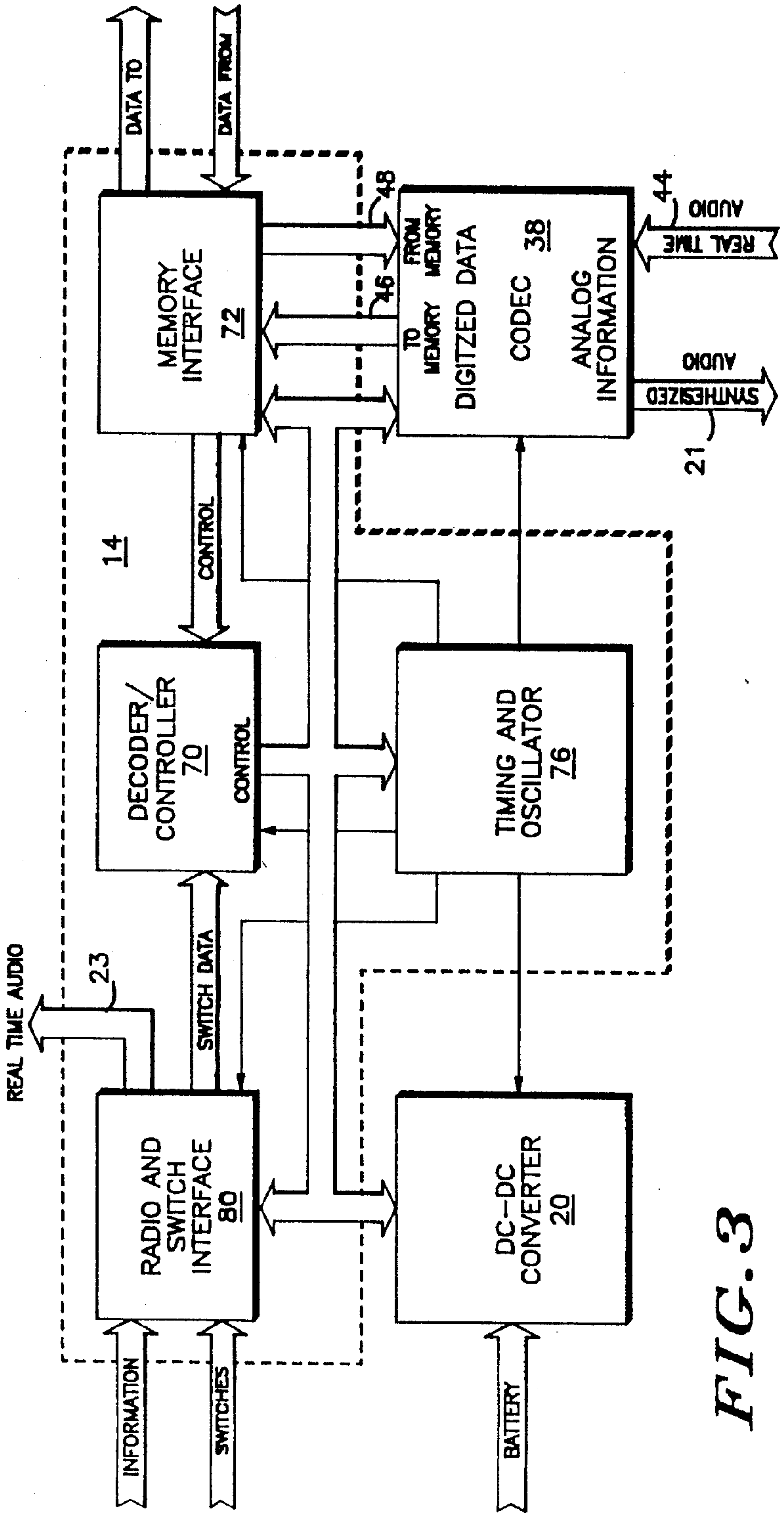
FIG. 3 is a more detailed illustration of the hardware controller embodiment of the paging receiver.

FIG. 3 shows a block diagram for the hardware embodiment of decoder 14 of FIG. 1. The hardware decoder 14 includes a radio and switch interface 80, a controller 70, a DC-to-DC current 20, and a timing and oscillator section 76. The controller 70 interprets input signals from the radio and switch interface to accomplish the read/write operations associated with the receiving, digitizing, storing, and playing back of messages. The controller 70 includes a program logic array sequencer, such as a Monolithic Memories 20L10 programmable array logic, a control hardware section for controlling the operations of the other sections of the decoder, a counter section for handling message queues, a counter section for handling the physical memory pointers, a memory section for flagging individual messages as read or unread, a small state machine to determine the modes status of the controller, and a multiplexing decoder to interpret hardware jumper inputs for controlling the length of messages, maximum number of messages, and the type of memory connected. In addition to controlling the operation of the sections of the decoder, the controller operates several sections of the controller in a battery saving mode in which power is selectively disabled from appropriate sections of the decoder when they are not needed. For example, at power up, the controller selectively disables power to the DC-to-DC converter and the memory interface.

The radio and switch interface 80 buffers inputs from the receiving unit and switches for generating the appropriate levels to the controller and CODEC 38. The radio and switch interface 80 may take the form of a level shifter, such as a Motorola MC14504B. The memory interface interfaces the controller to the main memory of the paging receiver by providing the necessary address, control and data transmission signals for storing and retrieving data to the memory. The memory interface may take the form of a Memory Management Unit as manufactured by Motorola under their designation MC68451.

Table 1 illustrates the number of messages that can be stored in the paging receiver using particular configurations of memory when the CODEC is operating at a specific bit rate. Even though the table lists specific memories, it is to be understood that numerous other memories can be used in the practice of the present invention. Continuing with the above described table, referring to the 1 megabyte CMOS DRAM, if the paging receiver is configured for two messages and the CODEC is operating at 25 kilobytes per second (KBPS), Table 1 illustrates that 20 seconds of voice information can be stored in one message slot. As is evident from Table 1, the CODEC operates in a plurality of operating rates such as 16 KBPS per second, 25 KBPS per second, and 32 KBPS per second. The operating rates can be selected by jumper connections within the paging receiver or by switches external to the paging receiver.

TABLE 1

Message Length as a Function of Bit Rate and Memory Size

| Number of Messages | 16 KBPS | 25 KBPS | 32 KBPS |
|---|---|---|---|
| One 256K CMOS DRAM | | | |
| 1 | 16 second | 10 second | 8 second |
| 2 | 8 second | 5 second | 4 second |
| Two 256K CMOS DRAMs | | | |
| 1 | 32 second | 20 second | 16 second |
| 2 | 16 second | 10 second | 8 second |
| 4 | 8 second | 5 second | 4 second |
| One 1 Meg CMOS DRAM | | | |
| 1 | 64 second | 40 second | 32 second |
| 2 | 32 second | 20 second | 16 second |
| 4 | 16 second | 10 second | 8 second |

Pursuing FIG. 3, the timing and oscillator section 76 provides the necessary timing signals and clock signals for all circuits in a manner well known in the art. The timing and oscillator section may take the form of a programmable timer/oscillator manufactured by Motorola under the designation MC145541B.

The DC-to-DC converter 20 provides the necessary operating voltage to the memory from one or two cell batteries. The DC-to-DC converter 20 also includes a current reference section to provide power for the remaining circuitry. In addition to the detailed diagram of the hardware decoder, the CODEC 38 is shown operatively coupled to the hardware decoder. The CODEC 38 digitizes real time audio information and provides the digitized data to the memory in phase for appropriate storage under the control of controller 70. When the paging receiver is operated in the play state, the CODEC under control of controller 70 receives data via memory interface 72 and converts the digitized data to synthesize audio information which is provided to the paging receiver user as synthesized audio.

III. Operation

In the operation of the paging receiver system, the paging receiver includes an on/off control switch 54, a reset switch 58, a mode switch 60, a volume control 55, a playback or play switch 56, a memory unread indicator 32, a memory full indicator 33, and an unread message counter 35. The on/off control 54 operates to turn the paging receiver on and off. The reset switch 58 resets the paging receiver by returning it to its standby or quiet state. The reset switch also functions as a real time audio channel monitor control, whereby activating the reset switch at any time allows the user to monitor the real time audio channel. The mode switch 60 places the paging receiver in different modes. The modes of operation of the paging receiver are the normal, push to listen PTL), and silent mode. For a better understanding of the different modes of operation, attention is directed to FIGS. 4–7 wherein the modes of operation are described in detail.

The volume control 55 varies the loudness of the paging receiver's audio. The play switch 56 operates to retrieve messages from memory. The memory unread indicator, such as an LCD or LED, indicates that the paging receiver has received a message that has not been heard by the user. The memory full indicator indicates that all memory slots include a message and that the next message received will overwrite the oldest message received in time in memory. The unread message counter 35 indicates the number of unread messages stored in memory.

Figure 4:
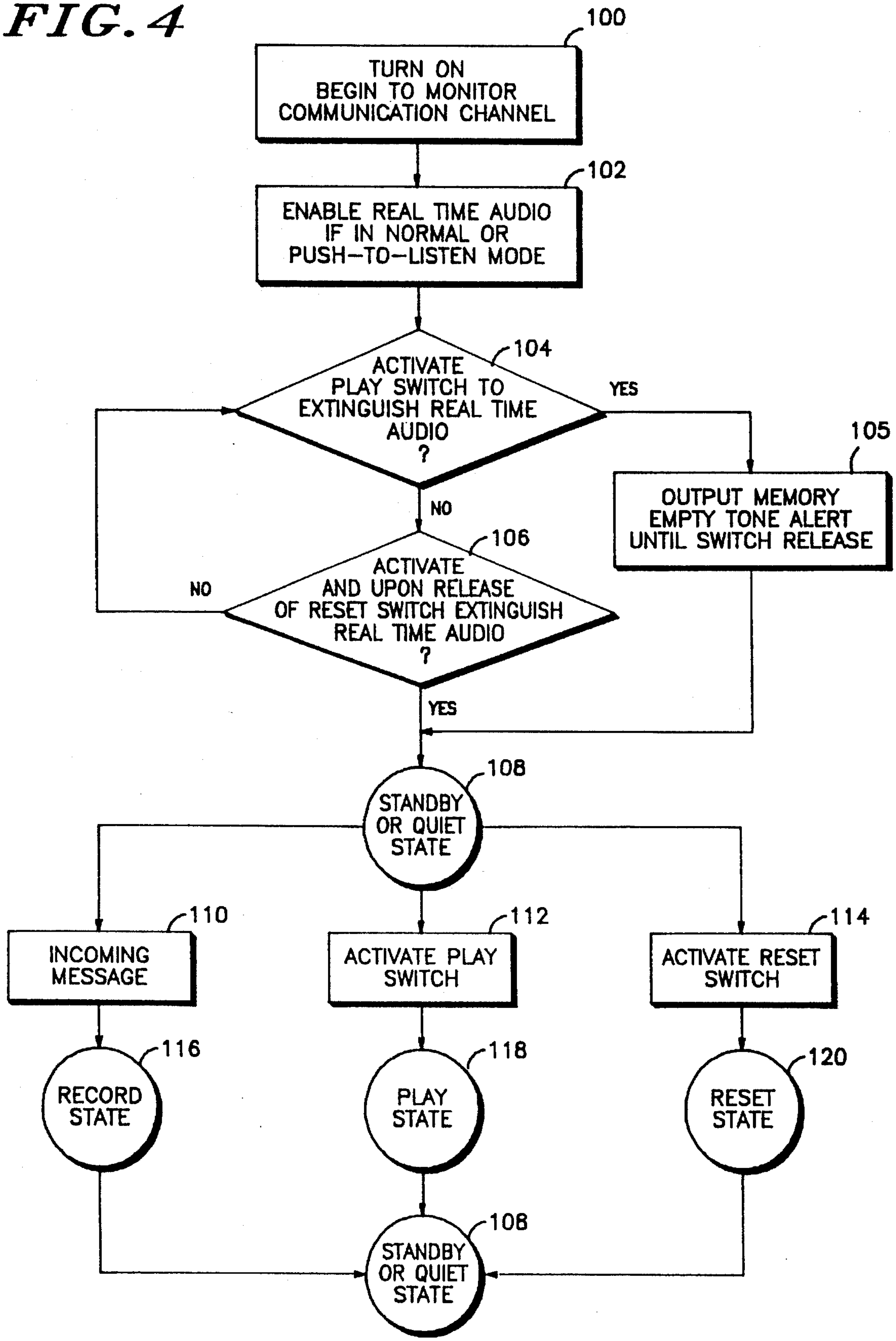
FIG. 4 is a state diagram illustrating the particular operating states of the digitized stored voice paging receiver of the present invention.

The explanation now proceeds to FIG. 4 which is a block diagram showing the operating states of the paging receiver of the present invention. The operating states comprise the standby, record, play, and reset states. Initially, the paging receiver is turned on and the paging receiver, depending upon the mode of operation, begins to monitor the communication channel for information, step 100. If the paging receiver is in the normal or PTL modes, the real time audio channel is enabled, step 102. Enabling the real time audio channel permits the user to hear the real time audio information. The play switch is activated for extinguishing the real time audio and the paging receiver state is transferred from the turn on state to a standby or quiet state 108, step 104. Additionally, upon activation of the play switch, a memory empty tone is produced until deactivation of the play switch, step 105.

Referring back to step 104, if the reset switch is activated, upon deactivation, the reset switch extinguishes the real time audio, step 106. Eventually, after turn-on, the reset or play switch is activated and the paging receiver system is vectored to the standby state 108. Upon occurrence of an incoming message 110, activation of a play switch 112, or activation of the-reset switch 114, the paging receiver system is vectored to either a record state 116, a play state 118, or a reset state 120, respectively. The explanation now proceeds to a discussion of each of the states.

A. Record State

In the record state 116, depending upon the position of the mode switch, one of three modes are selected, either the normal, silent or PTL mode.

1. Normal Mode

In the normal mode, after detecting incoming information, the paging receiver alerts the user with an alert characteristic of the decoder type, either a tone or vibrate alert. The alert is then followed by the voice message. Simultaneously, voice message is being recorded in memory and may be retrieved any time after storage. At any time during the record (storage) cycle, the activation and deactivation of the play or reset switch resets the paging receiver to its standby condition. Before storage is complete, the user can again monitor the channel with either the play or reset switch. If the audio is not reset at the end of storage, the paging receiver continues to monitor the channel until a activation of the play switch or reset switch. In practice, the paging receiver of the present invention has a limited storage time allocated to a given audio message, depending upon the amount of memory that is used within the paging receiver. If the voice message continues past the maximum storage time, the user may listen to the message in real time in its entirety but will not be able to replay the entire message since recording terminates after the predetermined storage time. On the other hand, if the message is shorter than the predetermined storage time, the paging receiver stores any channel noise after the message until the memory slot is filled.

Figure 5:
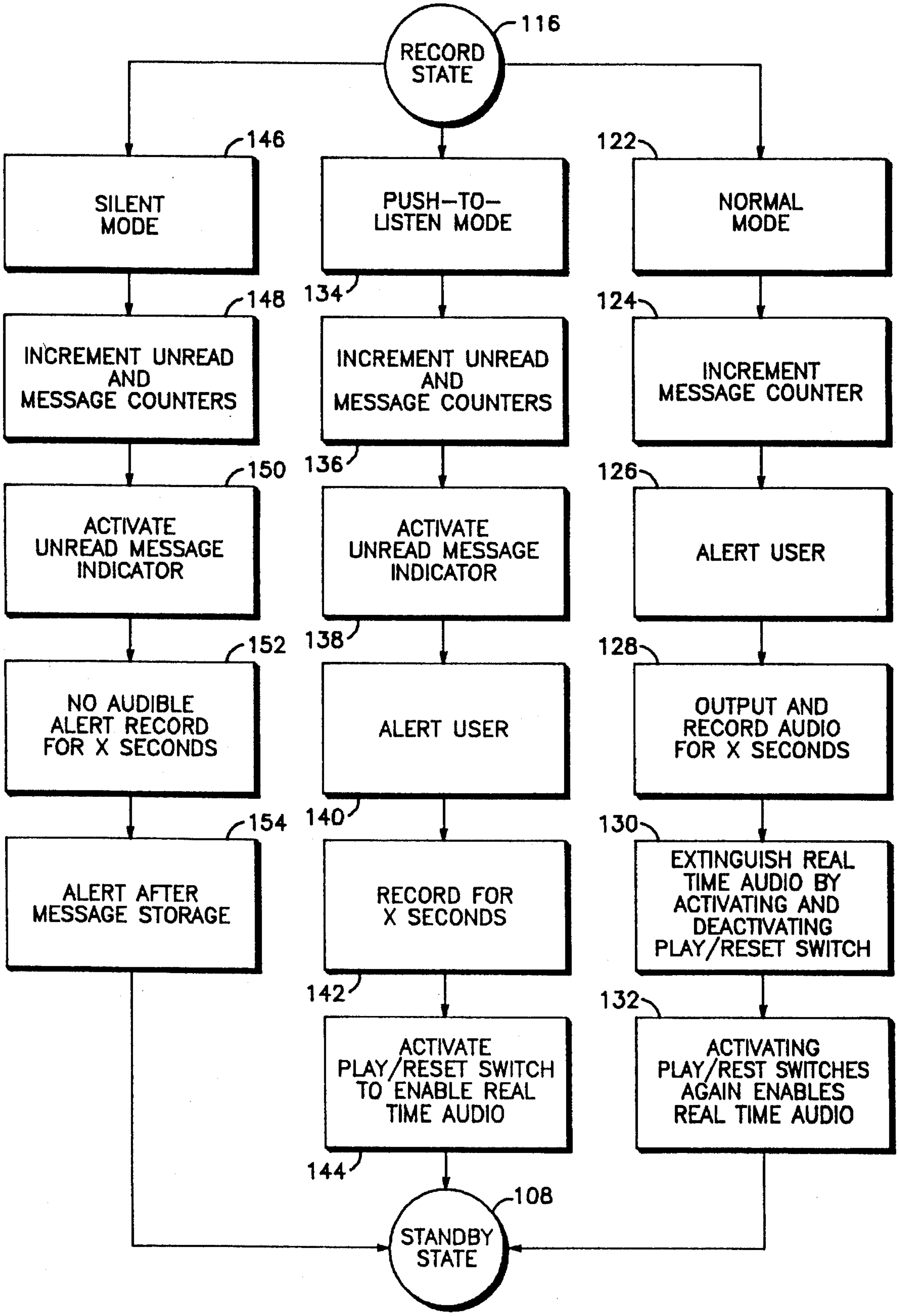
FIG. 5 is a detailed flow chart illustrating the record state of the digitized stored voice paging receiver.

Referring to FIG. 5, upon the occurrence of an incoming page and the selection of the mode switch to the normal mode, the operational state of the paging receiver is transferred to the normal mode, step 122. The message counter is incremented by one to indicate the recording of a new message 124. In the normal mode, the user is alerted and, depending upon the memory configuration of the paging receiver, a predetermined number of seconds (X), such as eight seconds (see Table 1 for examples of X), of voice information is recorded in the first available message memory slot, steps 126 and 128. The user is able to listen to the real time audio at the same time it is being recorded. Activating or deactivating the play or reset switch extinguishes the real time audio, step 130. Activating the play or reset switch (only if the storage cycle is not complete) again enables the real time audio, step 132. After recording "X" seconds of a voice information, the recording is terminated and the paging receiver continues to monitor the channel. If any voice information continues to exist after the predetermined number of seconds, it will be output in real time audio to the paging receiver user until extinguished. After the voice information is extinguished, real time audio output is terminated and the paging receiver system returns to the standby state, step 108.

2. Push to Listen (PTL) Mode

During receipt of a page in the PTL mode, the paging receiver alerts the user and indicates an unread message. However, instead of outputting voice audio as in the normal mode, the audio is automatically reset (no audio presented to the user), although the message does get recorded at that time. Upon activation and continued activation of either the play or reset switch, a user can hear a message in real time. At this time, the message is considered to be read. On the other hand, activating either switch during the alert but releasing it before the voice audio begins does not constitute reading of a message and the unread indicator remains active. Before the record cycle has ended, continued activation of either the play switch or reset switch monitors the channel. The subsequent release of the switch resets the paging receiver to its standby or quiet position.

In the PTL mode 134, the message counter and unread message incremented to indicate a message received, step 136. The unread message indicator is subsequently enabled to indicate to the user an unread message is recorded in memory, step 138. The user is alerted and the voice information is recorded for "X" seconds, steps 140–142. To hear the voice information in real time, the play or reset switch must be activated, step 144. The message is now considered "read". Upon recording for "X" seconds of voice information, the system returns to the standby state 108, but the user can continue to monitor the real time audio via either switch as long as the activation of the switch occurred before the termination of the record state.

3. Silent Mode

Upon receiving an incoming message, recording begins and the unread indicator is activated. If during the incoming voice message activation of either the play or reset switch occurs, the voice message is applied to the speaker transducer to provide a real time audio message. Once the record cycle has ended, the paging receiver alerts the user of a page. If the paging receiver includes a vibrator, the activation of either the play or reset switch resets the vibrator. After resetting the alert, activating the play switch permits the continued output of the voice message. This allows a user to stop vibration within the paging receiver without having the page automatically omitted. As in the push to listen mode, a message is considered unread and the unread indicator is activated. If the reset switch is accidentally pressed prior to the detection of a page (i.e., audio is enabled while a page is detected), the paging receiver reverts to the normal mode and must be manually reset. If the reset switch is activated after detection of the page, the paging receiver monitors the channel with no reversion to the normal mode.

Continuing with reference to FIG. 5, in the record state 116, if the mode switch is set to the silent mode position, an incoming page transfers the paging receiver from the standby state 108 to the silent mode 146. First, the unread message counter and message counter are incremented and the unread message indicator activated, steps 148 and 150. In the silent mode, no audible alert is generated, however, a paging receiver that is equipped with a vibrator will vibrate after storage for a predetermined number of seconds, steps 152–154. After "X" seconds of data are recorded, the system returns to the standby state 108.

In any of the above modes, except when alerting, activation and continued activation of the reset switch provides real time channel monitor. Also, in any of the above modes, if memory is full, an incoming message causes the oldest message to be overwritten, regardless of whether it is read or unread.

B. Play State

Figure 6:
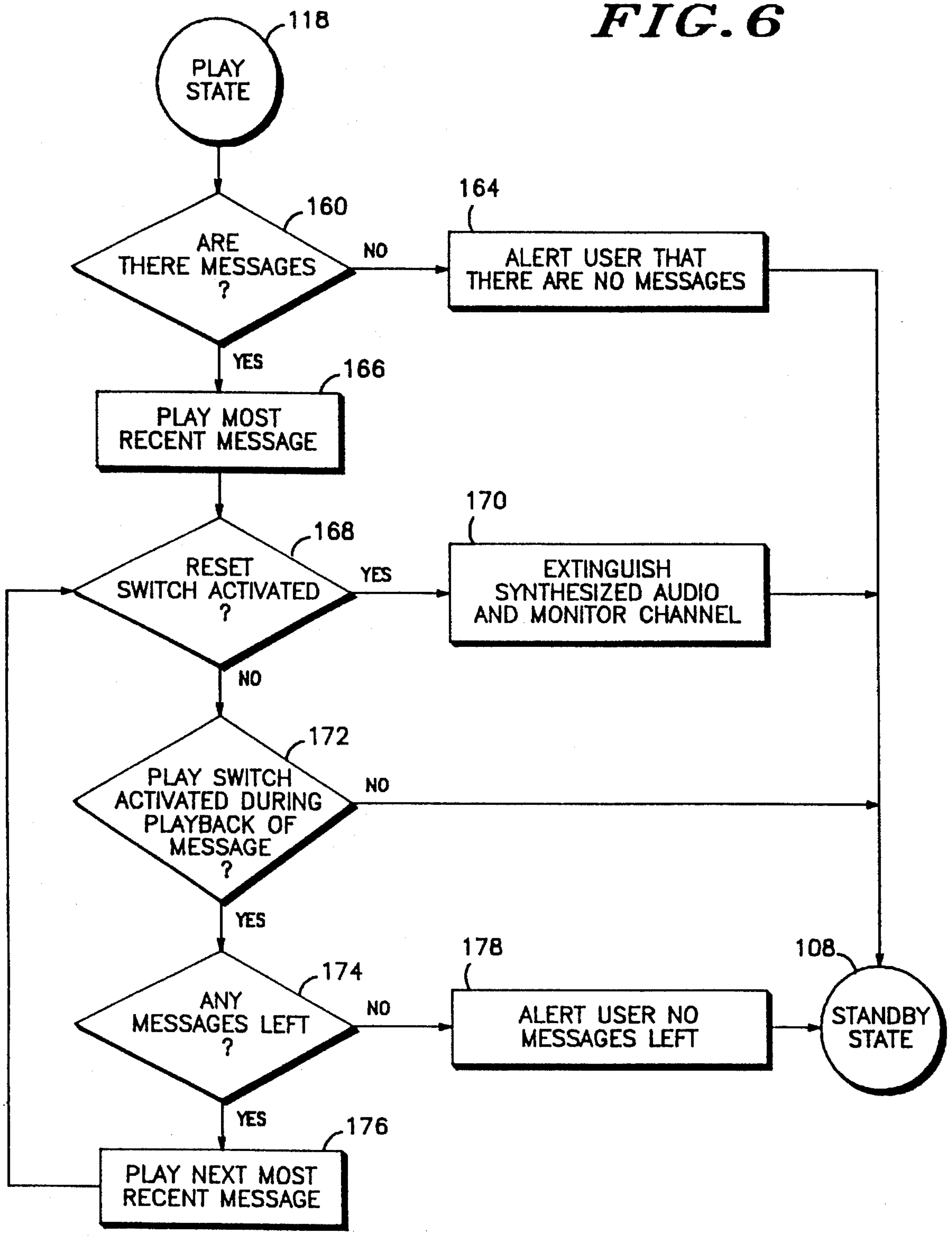
FIG. 6 is a flow chart showing the play state of the paging receiver of the present invention.
Figure 10A:
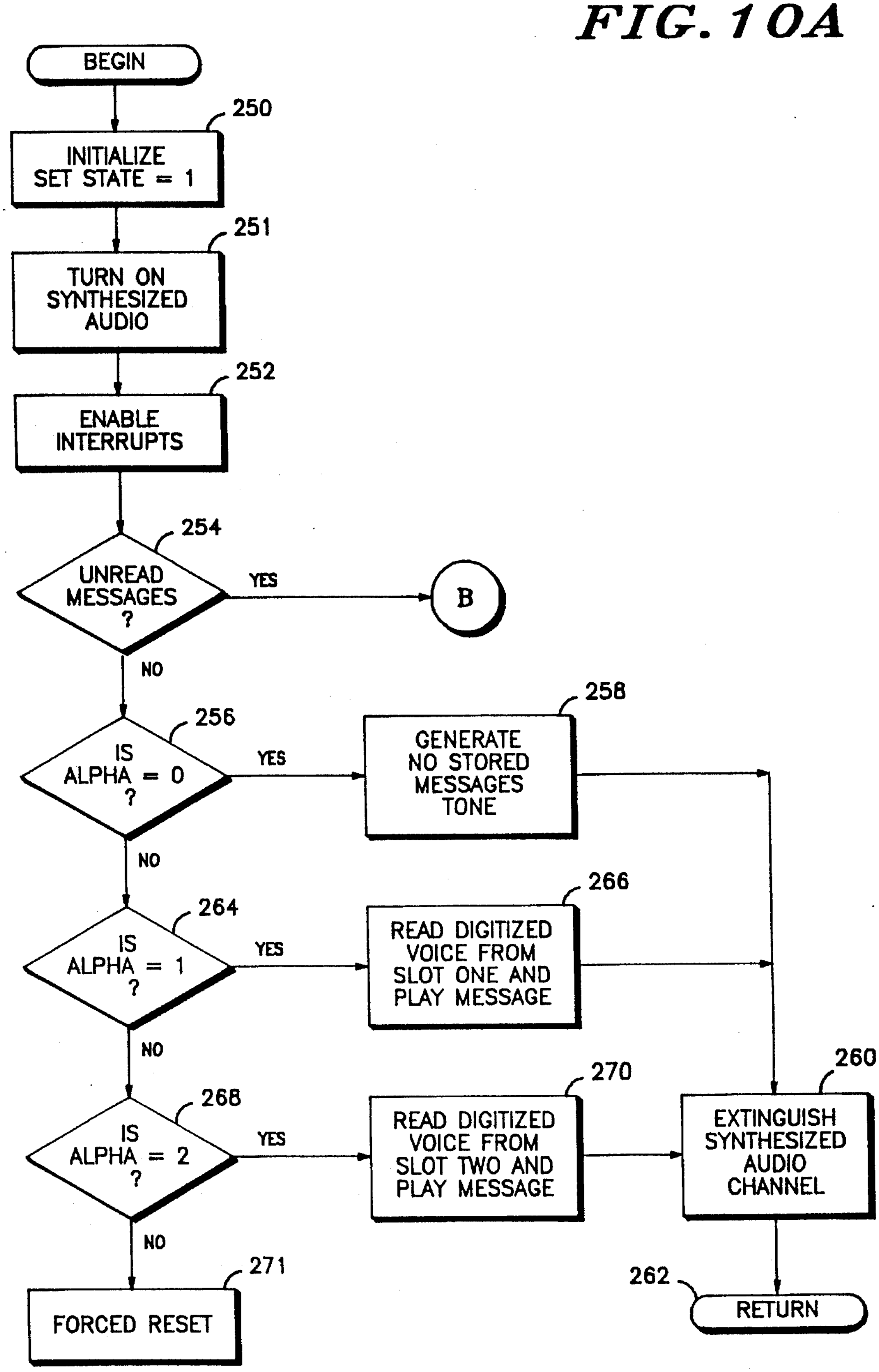
FIG. 10A is a flow chart of a method for playing the most recently stored digitized voice message from a memory position.

Referring to FIG. 6, from the standby state 108, the activation such as depression and deactivation such as release of the play switch transfers the system to the play state 118 to begin replaying of the stored messages from most recent to oldest. If the play switch is activated with no messages in memory, a two KHz "memory empty" tone sounds for the duration of activation indicating that the paging receiver is functioning but no messages have been received since turn on, steps 160–164. The system then returns to the standby state 108 when the switch is deactivated. Referring back to step 160, if messages exist, then the most recent message is played from memory by synthesizing the audio, step 166. Reference is made to FIGS. 10A–11 for a more detailed discussion of the operation of playing back stored voice messages via a microprocessor. If the reset switch is activated and deactivated at any time during the replay operation, replay is aborted by extinguishing the synthesized audio and the paging receiver returns to the standby state 108 after the reset switch is deactivated, steps 168–170. While the reset switch is activated, the real time audio is enabled.

Referring back to step 168, if the play switch is not activated during the replay of a message, the paging receiver returns to the standby state at the end of the message, unless there is an unread message in memory, step 172. If an unread message in memory exists, it is also replayed with a one-half second two KHz tone separating the messages. It is important to note that messages are automatically played in reverse chronological order, so if a read message exists between two unread messages, the read message is also heard.

The activation of the play button during replay of any message causes the pager to jump ahead and begin replay of the next most recent message in storage, steps 174–176. Activation of the play button during the replay of the oldest message in memory returns the pager to its initial standby state, step 178.

To clarify the issue of a "read" message, a message is considered "read" when the first two seconds of the message slot are played even if no voice is present. This prevents accidental clearing of the unread message flags if the user wants to reset his pager to the standby mode by cycling through the messages with the play switch.

If a new page is received during the replay operation, the replay is aborted and the paging receiver reverts to the normal mode. At the end of the incoming message, manual reset quiets the paging receiver. Once reset, the pager returns to the previously chosen mode of operation.

As previously stated, only messages received while in the silent or PTL modes are considered unread and are tracked by the unread message indicator. Messages heard in the PTL mode by holding down the play or reset switch following the alert are considered "read." Once all messages are read, the unread indicator is extinguished.

In the PTL or silent mode, a change made to the normal mode indicates that the user is now available to hear messages. Therefore, if there exists any unread messages in storage, all stored messages (whether read or unread) automatically begin playing in reverse chronological order until all unread messages are played out. Each message is separated by a one-half second two KHz tone. Pushing the reset switch extinguishes the synthesized audio portion of the message. At that time, the first message that is played is considered read if the first two seconds of the memory slot have expired. Any other unread messages remain unread and the unread message indicator continues to be active. If the most recent message is unread, pushing the reset switch cancels the unread message indicator (after the first two seconds) and resets the paging receiver to its standby state. Any other mode changes do not affect the messages.

C. Reset State

Figure 7:
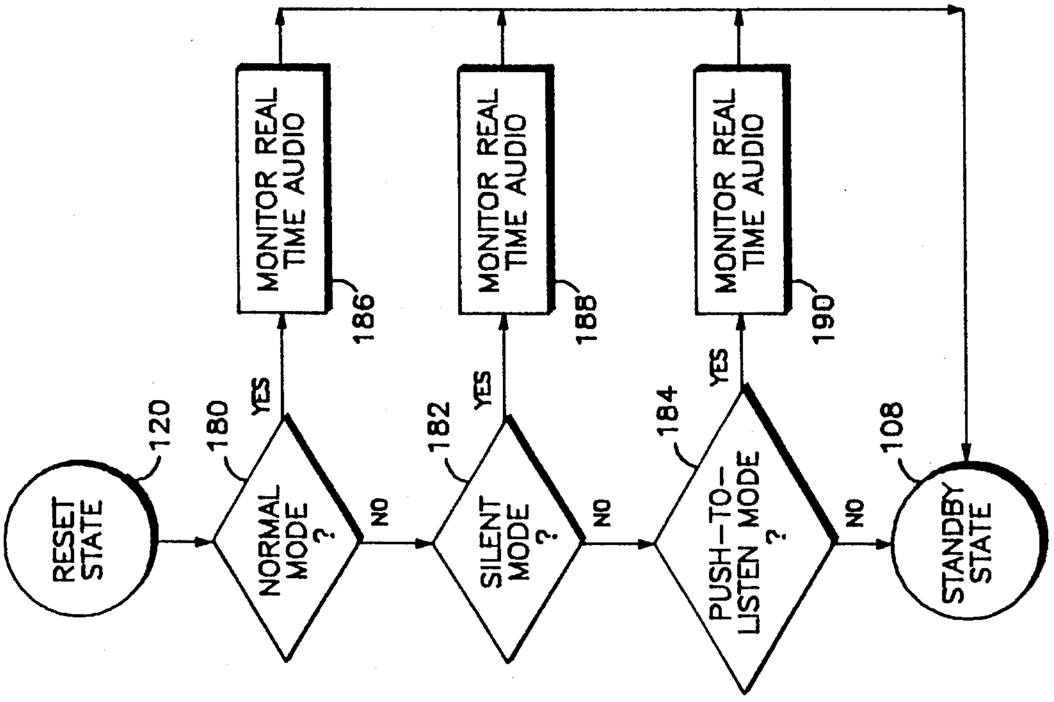
FIG. 7 is a flow chart illustrating the reset state of the paging receiver of the present invention.

Referring to FIG. 7, the activation and deactivation of the reset switch transfers the system to the reset state 120. If the mode switch is set to the normal mode, the real time audio is enabled, steps 180–186. If the silent mode is selected, the real time audio is enabled, steps 182–188. Finally, if the PTL mode is selected, the real time audio is also enabled, steps 184–190. The system is then returned to the standby state 108.

Prior to relating the above operation to the microprocessor embodiment of the paging receiver system, a summary of the operations in general may merit review. The following tables include a brief description comparing the operation of the play button and reset button during different operating states of the paging receiver system.

TABLE 1

| | NORMAL MODE | |
|---|---|---|
| | PLAY BUTTON | RESET BUTTON |
| After turn-on alert | Activating the switch extinguishes the real time audio and outputs the 2 KHz "memory empty" tone for duration of activation. Upon deactivation, the 2 KHz tone is extinguished. | Extinguishes real time audio channel upon deactivation. |
| Standby | With each successive activation, initiates playback of the next message in queue. If playing oldest message, activation switch returns radio to standby state. If no messages are stored, a "memory empty" tone is generated upon switch activation. | Monitor real time audio. |
| During Alert | No action. | No action. |
| During Voice | Extinguishes real time audio upon switch deactivation. | Extinguishes real time audio upon switch deactivation. |

TABLE 2

| PTL (PUSH-TO-LISTEN) MODE | | |
|---|---|---|
| | PLAY BUTTON | RESET BUTTON |
| After turn-on alert | Activating the switch outputs a 2 KHz "memory empty" tone for duration of activation. Resets real time audio channel on activation; resets 2 KHz tone upon deactivation. | Extinguishes real time audio upon deactivation. |
| Standby | With each successive activation, initiates playback of the next message in queue. If playing oldest message, activating switch returns radio to standby state. If no messages are stored, a "memory empty" tone is generated upon switch activation. | Monitor real time audio channel. |
| During Alert | No action. | No action. |
| During Voice | Listen to audio real time. Provides limited channel monitoring capability. | Listen to audio real time. |

TABLE 3

| SILENT MODE | | |
|---|---|---|
| | PLAY BUTTON | RESET BUTTON |
| At turn-on alert | Radio vibrates for a predetermined time period such as 8 seconds or until play switch is activated. | Radio vibrates for a predetermined time period such as 8 seconds until reset switch is activated. |
| Standby | With each successive activation, initiates playback of the next message in queue. If playing oldest message, activating the switch returns radio to standby state. If no messages are stored, a "memory empty" tone is generated upon switch activation. | Monitor real time audio channel. |
| During Alert | Resets vibrate alert. | Resets vibrate alert. |
| During Voice | (By chance) Listens to real time incoming audio. However, message is not considered read. | (By chance) Listens to real time incoming audio. However message is not considered read. |

IV. Microprocessor Embodiment of the Present Invention

FIGS. 8–12B are flow charts explaining the programs or routines as stored in the read only memory 30 to operate the microprocessor implementation of the paging receiver.

A. Power On Routine

Figure 8:
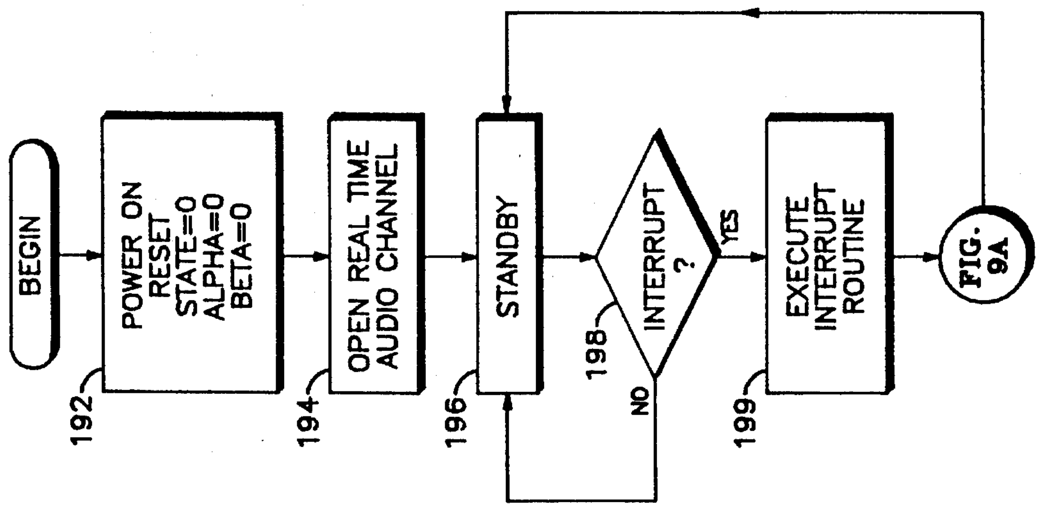
FIG. 8 is a flow chart of the operating method of a microprocessor embodiment of the present invention showing a power on reset routine.

Referring to FIG. 8, there is shown a flow chart for the power on sequence which takes the paging receiver from the off mode to the standby mode. Upon power up, the system is vectored to the power on reset routine, step 192. The power on reset routine initializes the hardware and the software to process the incoming paging information and to store the digitized voice information in the appropriate memory slots as received. Specifically, STATE, ALPHA, and BETA variables are reset to initial conditions. Briefly, STATE relates to playing back the message in chronological order from earliest to oldest. ALPHA points to the memory slot having the most recent message. BETA points to the memory slot having the next most recent message. Their use will become apparent with reference to the remaining figures. After basic housekeeping is completed, the power on routine passes control to the open routine, step 194. The open routine enables the real time audio channel to allow the paging receiver to listen to incoming information. Upon completion of these tasks, the open routine passes control to the standby routine, step 196.

The standby routine 196 enables the interrupt system for the microprocessor and prepares the paging receiver to receive incoming information. The system as illustrated is an interrupt driven system in which an event generates a specific level on an input line to the microprocessor. In response, the microprocessor saves the current executing address and branches to a memory address which includes a routine to process the interrupt generated by the event, step 198.

Two methods of implementing the above sequence are commonly used in microcomputers. These are called polled interrupts and vectored interrupts. Polled interrupts are those in which each peripheral device is tested, using either hardware or software, until the requesting device is found. Program execution is then directed to the appropriate interrupt-service routine which executes the data exchange. In this method, the priority of the device is determined by the relative position of a device in the polling sequence. In contrast, vectored interrupts are those in which the event causes program execution to proceed directly to the appropriate service routine.

In the illustrated embodiment, the polling interrupt system is described, however, it is to be understood that a vectored interrupt system would work just as well. After the interrupt system is enabled, the microprocessor waits in the standby state for an interrupt, step 196.

B. Interrupt Routine

Figure 9A:
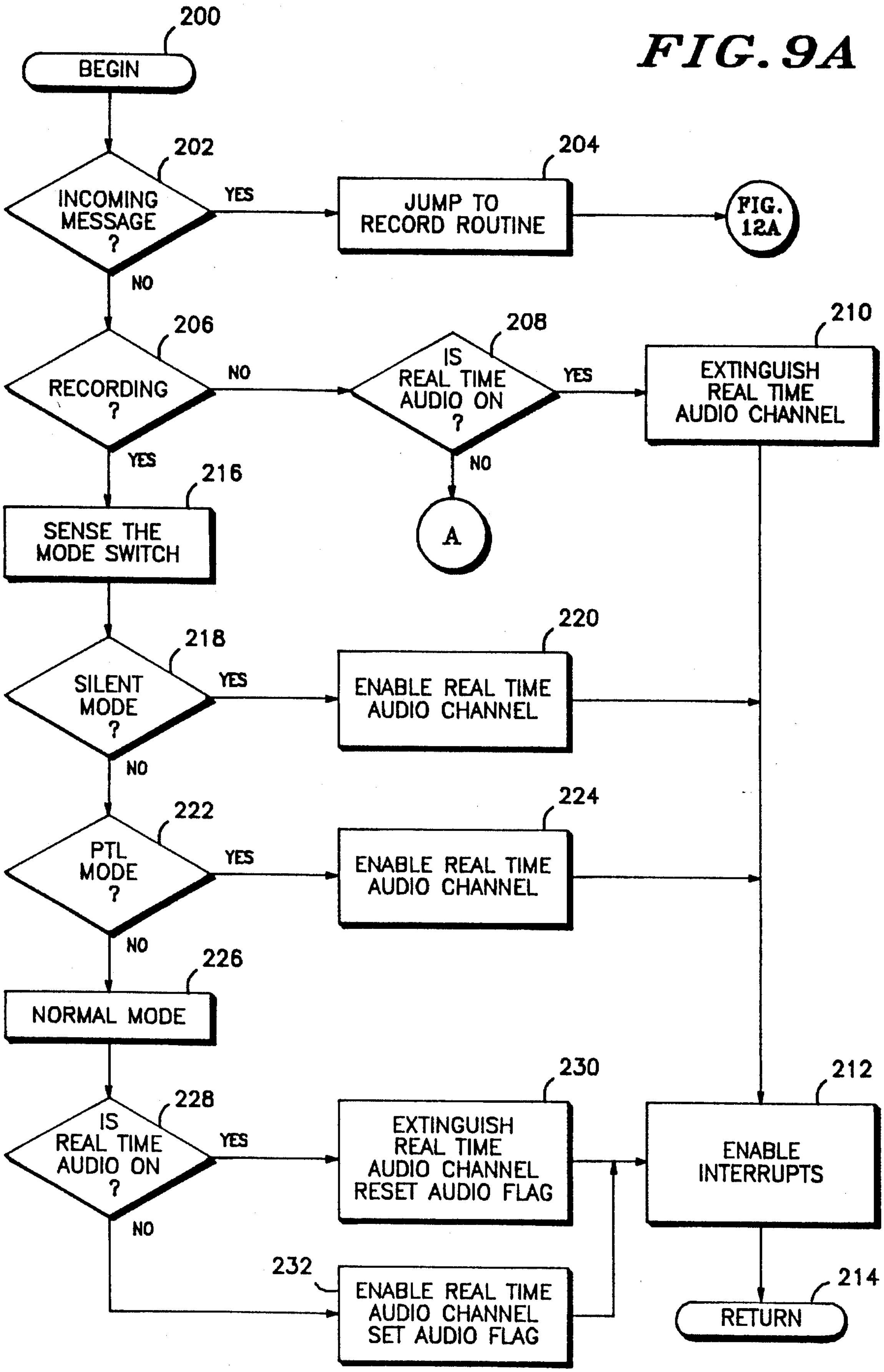
FIG. 9A is a flow chart illustrating an interrupt routine for the microprocessor embodiment of the present invention.
Figure 9B:
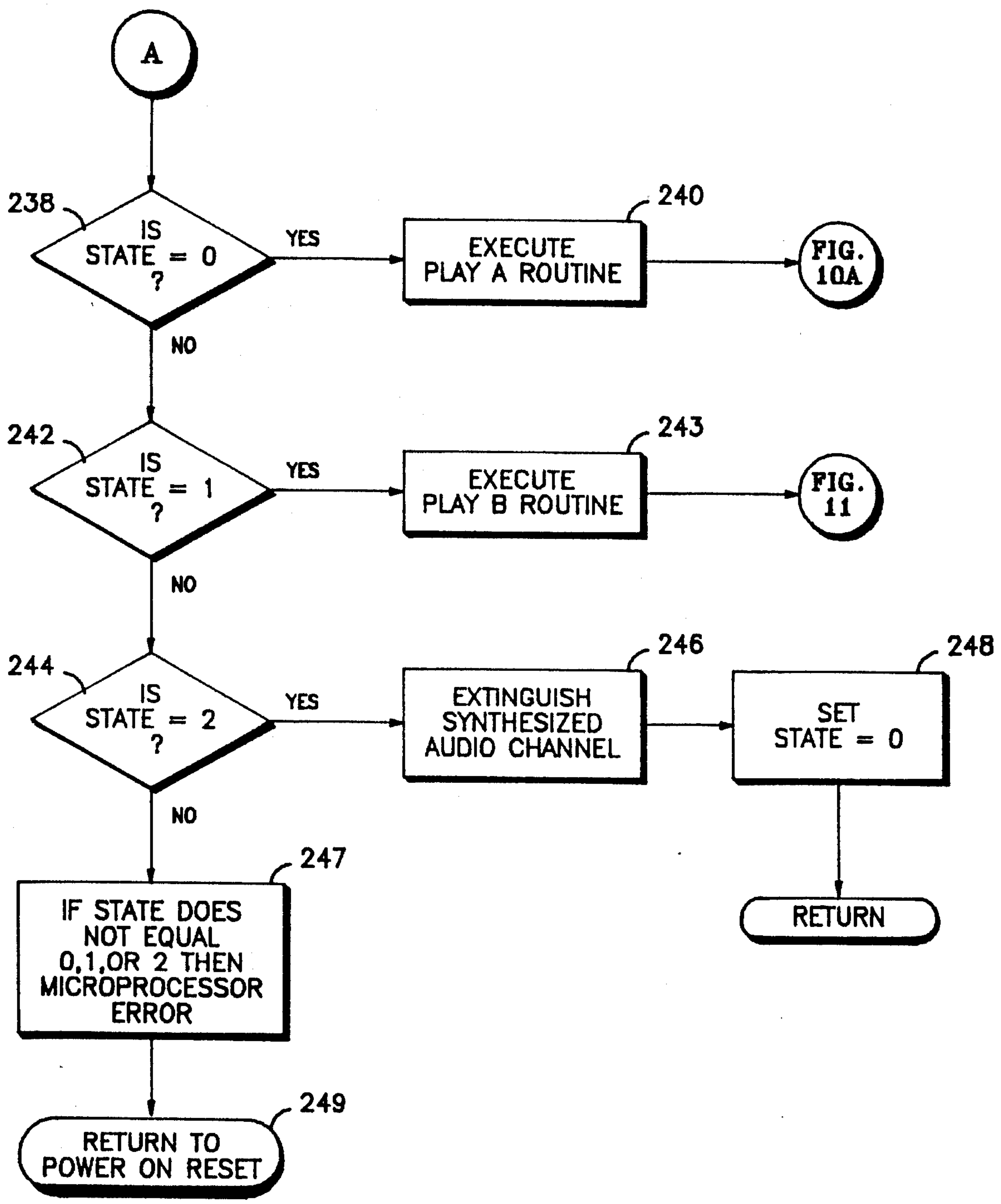
FIG. 9B is a continuation of FIG. 9A showing the interrupt routine for the play state.

Eventually, an interrupt is caused by either an incoming paging information, the activation of the reset switch, or the activation of the play switch, step 198. Upon the occurrence of the interrupt, the microprocessor is vectored to an interrupt routine, step 199, a detailed flow chart of which is shown in FIGS. 9A–B. Since the receipt of incoming paging information, the activation of the reset switch or activation of the play switch generates an interrupt, the microprocessor must determine which condition generated the interrupt. The microprocessor is vectored to the beginning of the interrupt routine, step 200. The method then determines if the interrupt was generated by either incoming information, the reset switch or the play switch.

Referring to FIG. 9A, if the interrupt is caused by an incoming message, the message must be recorded, step 202. The method vectors the microprocessor to a record routine which records the message into one of a plurality of empty message slots, step 204.. If no empty message slots exist, the message is recorded into the message slot having the oldest message. A complete disclosure of the record routine is shown with respect to FIGS. 12A–B.

For purposes of illustration, the paging receiver of the present invention is shown with only two message slots. However, a plurality of message slots can be used which is the subject of copending application entitled "Prioritization of Stored Messages in a Digital Voice Paging Receiver", having Ser. No. 07/068,683, filed even date herewith, laving attorney's docket number CM00485J, invented by Fisch et al., being assigned to the assignee of the present invention, the disclosure of which is hereby incorporated by reference.

Referring back to step 202, it is determined whether the paging receiver is recording by polling an encoder line on the CODEC, step 206. If the system is not in the record state, the system is in either the play or standby state and the interrupt was generated either by the play or reset switch, step 208. If the real time audio is enabled, this implies the user is monitoring the real time audio channel in the standby state and the method extinguishes the real,time audio, step 210. After the real time audio is extinguished, the method enables the interrupts so as to detect any further interrupts, step 212. The method then returns. Referring back to step 208, if the paging receiver is not recording and the real time audio channel is extinguished, this implies the system is in the play state. Thus, the method determines whether the user has activated the play switch to play back a message as will be discussed with reference to FIG. 9B.

Referring back to step 206, if the system is recording, then the interrupt was generated by either the play or reset switch during the record state. The method then senses the mode switch to determine whether the silent, PTL, or normal modes are selected, step 216. The method then determines whether the silent mode is selected, step 218. If the silent mode is selected, this implies that the user has activated the play or reset switch to enable the real time audio channel. The method enables the real time audio channel, enables the interrupts and returns, steps 220, 212 and 214.

Referring back to step 218, the method then determines if the PTL mode is selected, step 222. If the PTL mode is selected, this implies that the user wishes to hear the real time audio while it is being recorded. Therefore, the method enables the real time audio channel, step 224. The method then enables the interrupts, and returns, steps 212–214.

If the system is not in the silent or PTL mode, then the system must be in the normal mode, step 226. In this case, it is determined whether the real time audio is enabled by checking an audio flag which is set by the record routine, the discussion of which is given with respect to FIGS. 12A–B, step 228. If the real time audio flag is on, the method extinguishes the real time audio channel and resets the audio flag, step 230. If the real time audio flag is off, the real time audio channel is enabled and the audio flag is set, step 232. After either extinguishing or enabling the real time audio channel, the interrupts are enabled and the system returns, steps 212–214.

Referring back to step 208, if the real time audio channel is off and the system is not recording, then the interrupt is a play switch interrupt. The method then places the system in the play state. Referring to FIG. 9B, there is shown a method for operating the system in the play state.

In the play state, a message is played back starting with the most recent message. If the next message is required, the play switch must be activated during the playing of the present message. Referring to FIG. 9B, if the synthesized audio is on, this implies that the next message is to be played. If the synthesized audio is off, the most recent message is played back. This is accomplished by the play "A" routine. Briefly, play "A" routine plays the most recent message stored in the two message slots as determined by the ALPHA variable. The play "A" routine is discussed in detail with respect to FIG. 10A. If the synthesized audio is on, the user desires to play back voice information stored in the next message slot. A variable STATE indicates if the synthesized audio is on or off. If STATE is zero, then the synthesized audio is off. If STATE is on, then the synthesized audio is on. The method first determines if STATE is equal to zero, step 238. If STATE is zero, the system executes the play "A" routine which will play the most recent message after the present synthesized audio message terminates, step 240.

Referring back to step 238, since the routine play "A" sets the variable STATE equal to one during its execution, the most recent message is playing. If the play switch is activated during the most recent message, the system plays back the second most recent message, step 242. Since the system finds the variable STATE equal to one, the system is vectored to a play "B" routine, step 243. The play "B" routine plays the second most recent message. At the beginning of the play "B" routine, the STATE variable is set equal to two. Referring back to step 242, if the play switch is activated during the play back of the second most recent message, the method vectors the system to extinguish the synthesized audio channel, steps 244–246. The method then sets the variable STATE equal to zero so that repeated activation of the play switch causes the system to repeat steps 234–248. If the state is higher than the number of message slots (as illustrated two message slots), then a microprocessor failure has probably occurred and the system jumps to the power on reset for reinitialization of the microprocessor, steps 247 and 249.

C. Play A Routine

FIG. 10A shows a flow chart for the play "A" routine which plays the most recent message from one of two message slots in the paging receiver. The method begins by setting the variable STATE equal to one to notify the system that the most recent message is being played, step 250. In addition to setting the variable STATE equal to one, the synthesized audio channel is activated, step 251. The method then enables the interrupt to allow the system to respond to incoming information, step 252. If paging information is received during the play routine, the play routine is terminated and the paging receiver responds to the incoming paging information. The method then determines if there are any unread messages, step 254. If there are unread messages, the system is vectored to an unread message routine.

Referring back to step 254, if there are no unread messages, then the method checks to determine if there are messages stored, step 256. A variable ALPHA, dependent on the number of messages, is analyzed. If ALPHA equals zero, then no messages are in the receiver and the system generates a "memory empty" tone to indicate that there are no stored messages, steps 256–258. The system then deactivates the synthesized audio channel and waits for incoming paging information or for a user input, steps 260 and 262.

Referring back to step 256, if there are stored messages, then it is determined if the most recent message is in slot one or slot two. If ALPHA equals one, the most recent message is in the first message slot, step 264. The system begins reading the digitized data in the first message slot and providing a replica of the original audio information on the synthesized audio channel to the user, step 266. After playing back the most recent message, the system extinguishes the synthesized audio channel and returns, steps 260–262.

Referring back to step 264, if ALPHA is not equal to one, then ALPHA is equal to two or greater. If ALPHA equals two, the most recent message is in slot two and the system reads the digitized data from slot two and provides synthesized audio to the user, step 270. After playing back the synthesized audio from message slot two, the system extinguishes the audio channel and returns, steps 260–262.

Referring back to step 268, if ALPHA is greater than two, a malfunction has occurred in the microprocessor. Thus, the system is vectored to a force reset, step 271.

Figure 10B:
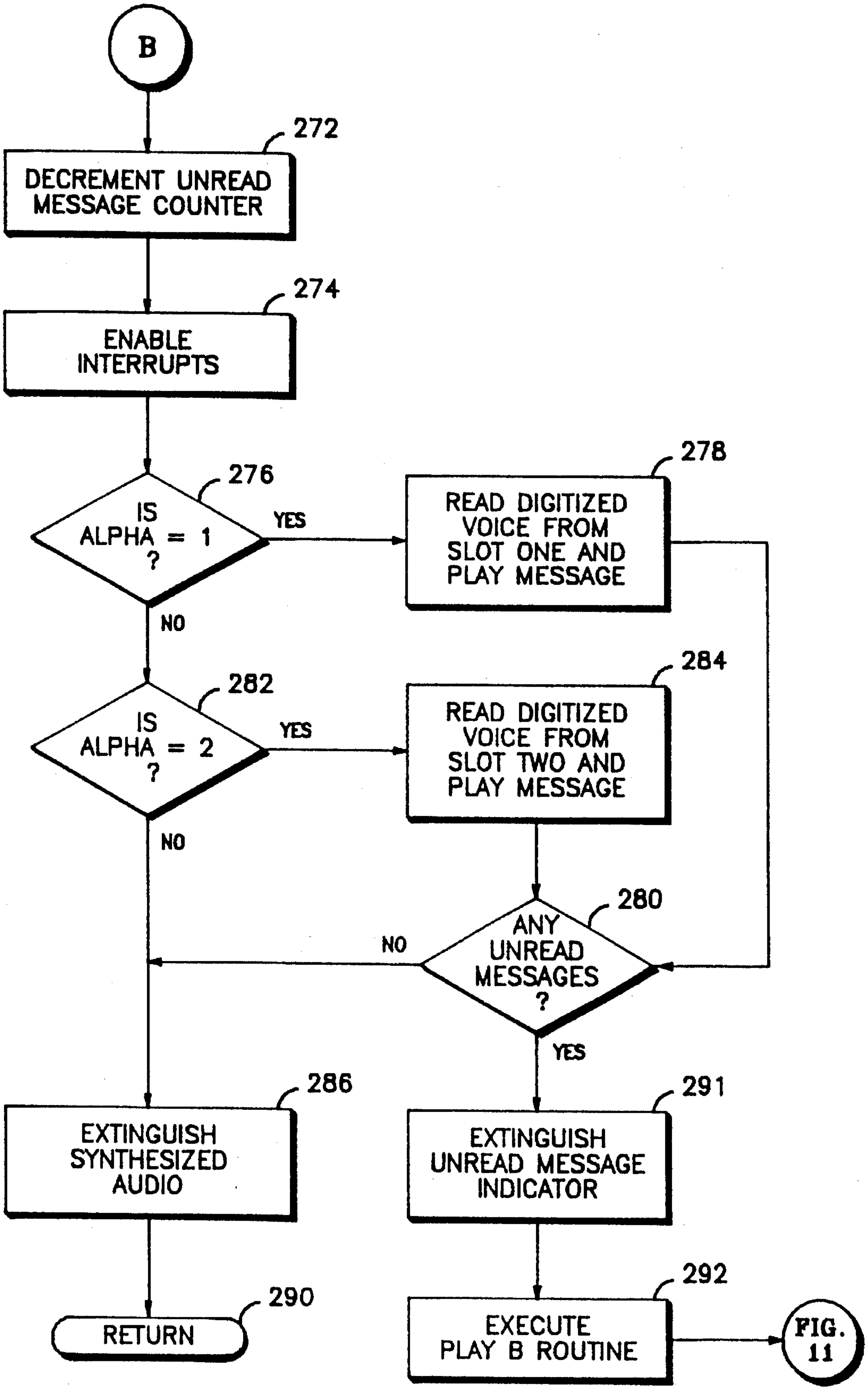
FIG. 10B is a continuation of FIG. 10A illustrating a flow chart showing the operation of the microprocessor embodiment of the present invention for playing unread messages.
Figure 11:
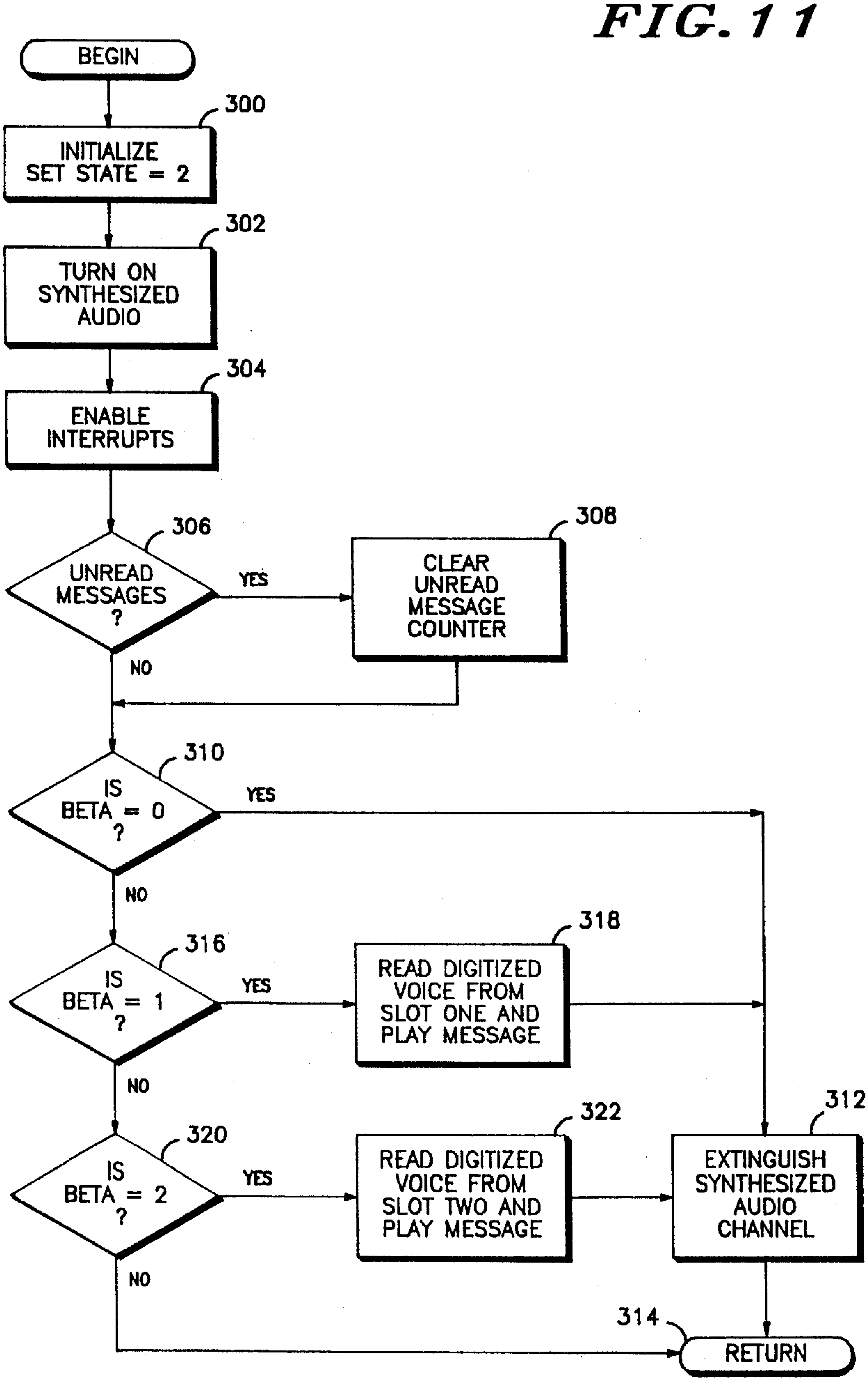
FIG. 11 is a flow chart for the microprocessor embodiment of the present invention illustrating the playback of the next most recent message stored in the paging receiver.

Referring back to step 254, if there are unread messages, the system is vectored to an unread message routine as shown in FIG. 10B. Referring to FIG. 10B, the unread message counter is decremented to signify the playing back of an unread message, step 272. Next, the interrupts are enabled so the system can respond to incoming information, step 274. Next, ALPHA is tested to determine the location of the most recent message. If ALPHA equals one, the most recent message is in the first message slot and the system reads the digitized voice information from the most recent and plays a replica of the information on the synthesized audio channel, steps 276 and 278. After playing back the message from the first message slot, it is determined if there are any other unread messages remaining, step 280. If the answer is yes, then the system is vectored to the play "B" routine which plays back the second most recent message. Since in the illustrated embodiment there are only two message slots, the playing back of the second most recent message indicates no unread messages remain. Therefore, the unread message indicator is extinguished, step 291. The play "B" routine is then executed, step 292.

Referring back to step 276, if ALPHA is not equal to one, then it is determined if ALPHA equals two, step 282. If ALPHA equals two, then the most recent message is in the second message slot and the system plays back the digital stored voice in the second message slot, step 284. After playing back the digital information in the second message slot, it is determined if there are any unread messages, step 280. If so, then the second most recent message is played, steps 291 and 292. Referring back to step 282, if ALPHA is not equal to one or two, then there are no messages to play and the synthesized audio channel is extinguished, step 286. The system then returns to the standby state, step 290.

D. Play B Routine

The play B routine plays back the second most recent message from either one of the message slots. The play "B" routine is executed after the play "A" routine executes. Referring to FIG. 11, the routine is entered and the variable STATE is set equal to two for notifying the system that the second most recent message is to be played, step 300. The synthesized audio channel is then activated and the interrupts enabled to allow the paging receiver to respond immediately to incoming paging information, steps 302 and 304. It is then determined if any unread messages are available, step 306. If there are unread messages available, then the unread message counter is cleared, since all unread messages will have been read after the play "B" routine replays the oldest message in a two-message slot system, step 308.

The method then determines the value of a variable named BETA. BETA determines whether the second most recent message is either in the first message slot or the second message slot. If BETA equals zero, there is no second most recent message and the system is vectored to the standby state after deactivating the audio channel, steps 310–314. If BETA is not equal to zero, then BETA is tested for the value one, step 316. If BETA equals one, the second most recent message is in the first message slot and the system plays back the second most recent message contained in the first message slot by synthesizing the digital voice information through the CODEC and replicating the voice information on the synthesized audio channel, step 318. After the synthesized voice information is played back, the system deactivates the synthesized audio channel and returns, steps 312–314.

Referring back to step 316, BETA is checked for the value two, step 320. If BETA equals two, then the second most recent message is in the second message slot and the system plays back the digitized voice information in the second message slot through the CODEC to the synthesized audio channel, step 322. After the voice information is played back, the system returns to the standby state, step 314.

E. Record Routine

Figure 12A:
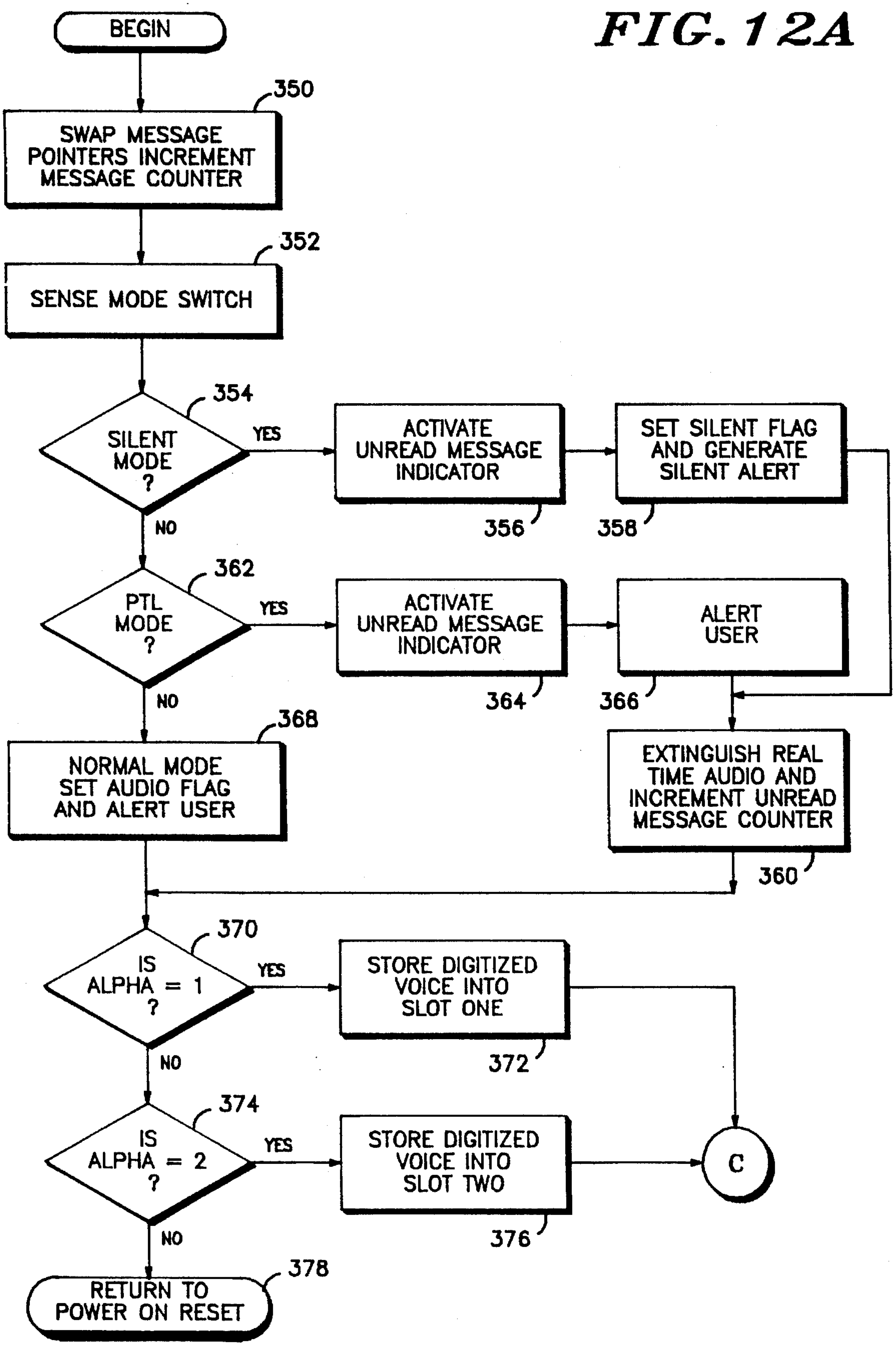
FIG. 12A illustrates the record routine for the microprocessor embodiment of the present invention.
Figure 12B:
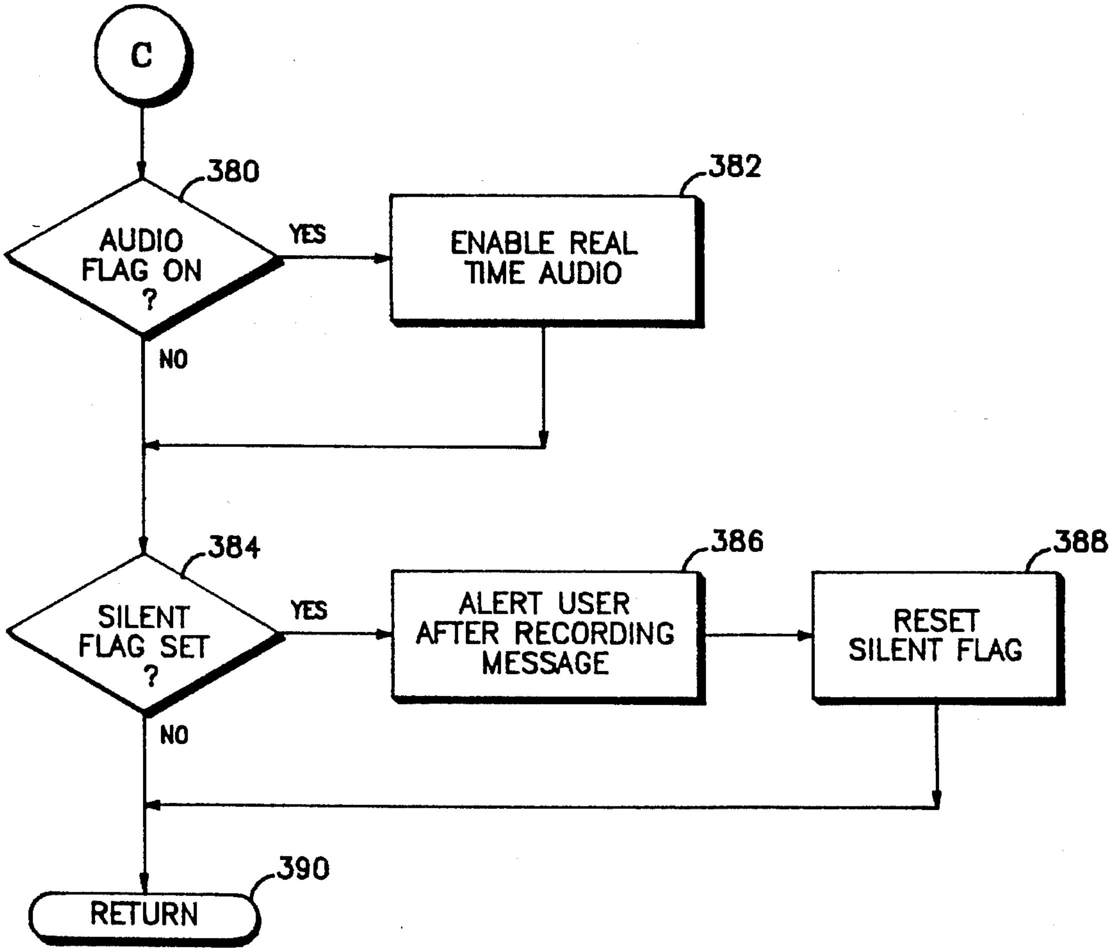
FIG. 12B is a continuation of FIG. 12A illustrating the record routine of the microprocessor embodiment of the present invention.

FIGS. 12A–B show a detailed flow chart for the record routine of the present invention. The record routine records the digitized audio signal from the CODEC in the appropriate message slot and tags the message as the most recent message.

The routine begins by updating the message pointers, ALPHA and BETA, step 350. In a two-slot message system, since ALPHA points to the most recent message, the message being recorded will replace the second most recent message pointed to by BETA. Therefore, the pointers ALPHA and BETA are swapped so that they point to the most recent message and second most recent message respectively. After the values for ALPHA and BETA are swapped, the method determines the mode of the system, step 352. The method then determines if it is in the silent mode, step 354. If the system is in the silent mode, the unread message indicator is activated to notify the user that a message has been recorded, step 356. Next, a silent flag is set to indicate a message has been recorded in the silent mode, step 358. The real time audio channel is extinguished and the unread message counter is incremented, step 360. The method then determines which message slot to store the digitized voice.

Referring back to step 354, if the system is not in the silent mode, then the system is either in the PTL or the normal mode. The method then determines if it is in the PTL mode, step 362. If it is in the PTL mode, then the unread message indicator is activated, a user alert generated, and the audio real time channel is extinguished, steps 364, 366 and 360.

Referring back to step 362, if the system is not in the PTL mode, then the system is in the normal mode, an audio flag is set and a user alert generated, step 368. The method then determines which message slot is available for recording by analyzing the value in the variable ALPHA. If ALPHA equals one, then the message is recorded in the first message slot, steps 370 and 372. As is evident, if a previous message is contained in the first message slot, the previous message is overwritten. If ALPHA is two, the message is recorded in the second message slot, steps 374 and 376. If ALPHA is not one or two, then an error has occurred and the microprocessor is reinitialized, step 378.

Referring to FIG. 12B, there is shown a continuation of the flow chart of FIG. 12A. After recording of the message in the appropriate message slot, the audio flag is checked, step 380. If the audio flag is set, the real time audio channel is enabled, step 382. Next, the silent flag is checked, step 384. If the silent flag has been previously set by the selection of the silent mode, a silent alert such as a vibration alert is generated, step 386. Please note that the silent alert occurs after recording the message. Therefore, in the silent mode, messages are received, digitized, and recorded and then the user is alerted. After alerting the user, the silent flag is reset, step 388. The method then returns to the standby state, step 390.

Thus, there has been shown an apparatus and method for transmitting information to a paging receiver in a plural population of paging receivers. The transmitted information includes control signals followed by analog information having at least one analog voice message. The paging receiver of the present invention receives and decodes the information to recover the control signals and the analog information. The control signals provide receiver control information. The receiver is selectively enabled correlating to the received control information. The received analog information is converted to digital information being a replica of the analog voice information and stored in a plurality of message slots in the paging receiver. In response to a user input, a message slot is selected and the stored digital information is recalled and presented to the user. The synthesized voice information presented to the user is a replica of the original analog voice message.

It should be apparent from the above description that numerous variations can be made from the preferred embodiment described herein without departing from the scope of the invention. Reference is therefore made to the claims which follow for a definition of the invention.

What is claimed is:

1. A digital voice storage communication system including:

at least one transmitting station selectively addressing and transmitting a communication packet including an address code followed by a voice message;

a least two receiving stations having a corresponding predetermined stored address, each comprising:

a) a receiver circuit for receiving an incoming signal carrying said communication packet;

b) decoder circuitry responsive to said receiver circuit for emitting a record enable signal responsive to said communication packet carried by said incoming signal, including:

a comparator for comparing said predetermined stored address with said communication packet address code and automatically generating said record enable signal in response to said comparison, without reference to a separate record enable signal from said transmitter;

c) digital memory for storing said voice message of said communication packet in response to said record enable signal;

d) signal conversion circuitry for converting digital data in said digital memory into analog data for playback.

2. The digital voice storage communication system of claim 1, wherein said decoder circuitry further includes circuitry for deactivating said digital memory when said record enable signal ceases.

3. The digital voice storage communication system of claim 1, additionally comprising an edge detector responsive to said receiver circuits and sensitive to an edge of said record enable signal for automatically resetting and initiating said digital voice storage communication system to permit said digital memory to record a new voice message.

4. The digital voice storage communication system of claim 1, additionally comprising a memory address selector for storing information indicative of available memory space to protect said memory from recording over previously stored messages.

5. The digital voice storage communication system of claim 2, additionally comprising a timer, wherein said decoder is responsive to said timer to terminate said enable signal upon expiration of a preset period of time thereby enabling said digital memory to record a new voice message.

6. The digital voice storage communication system of claim 1, wherein said decoder circuitry generates said record enable signal continuously for the duration of said incoming voice message.

7. The digital voice storage communication system of claim 1, wherein said decoder circuitry is voice actuated to generate said record enable signal responsive to said incoming voice message.

8. A digital voice storage communication system as defined in claim 1, wherein said signal conversion circuitry converts said voice message of said communication packet from analog to digital format.

9. A digital voice storage communication system as defined in claim 1, wherein said communication packet additionally comprises command data and wherein said address code and said command data are followed with substantially no delay by said voice message in said communication data packet.

10. A digital voice storage communication system as defined in claim 1, wherein said communication packet includes a voice message whose length is variable.

11. A digital voice storage communication system as defined in claim 10, wherein said digital memory sequentially stores digital voice messages having different lengths.

12. A digital voice storage communication system as defined in claim 1, wherein said signal conversion circuitry operates during said record enable signal.

13. A digital voice storage communication system as defined in claim 1, additionally comprising:

an operator activated playback switch for retrieving said voice message stored in said digital memory and for activating said signal conversion circuitry.

14. A digital voice storage communication system as defined in claim 13, additionally comprising:

a switch for selection of said voice messages from said digital memory for conversion by said signal conversion circuitry.

15. A digital voice storage communication system as defined in claim 4, wherein said memory address selector generates a signal to erase the recorded voice message which has resided in said digital memory longer than any other stored message.

16. A digital voice storage communication system as defined in claim 1, wherein said digital memory records said voice messages silently.

* * * * *